US012744625B2

(12) United States Patent
Kim et al.

(10) Patent No.: US 12,744,625 B2
(45) Date of Patent: Sep. 22, 2026

(54) METHOD FOR TRANSMITTING SIGNAL ON BASIS OF HARQ IN WIRELESS COMMUNICATION SYSTEM, AND APPARATUS THEREFOR

(71) Applicant: LG Electronics Inc., Seoul (KR)

(72) Inventors: Bonghoe Kim, Seoul (KR); Jongwoong Shin, Seoul (KR); Sangrim Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 18/577,024

(22) PCT Filed: Jul. 5, 2021

(86) PCT No.: PCT/KR2021/008512

§ 371 (c)(1),
(2) Date: Jan. 5, 2024

(87) PCT Pub. No.: WO2023/282366

PCT Pub. Date: Jan. 12, 2023

(65) Prior Publication Data

US 2024/0313898 A1 Sep. 19, 2024

(51) Int. Cl.
*H03M 13/00* (2006.01)
*H04L 1/00* (2006.01)
*H04L 1/1812* (2023.01)
*H04L 1/1829* (2023.01)

(52) U.S. Cl.
CPC ...... *H04L 1/1819* (2013.01); *H03M 13/6306* (2013.01); *H03M 13/635* (2013.01); *H04L 1/0056* (2013.01); *H04L 1/1854* (2013.01)

(58) Field of Classification Search
None
See application file for complete search history.

(56) References Cited

U.S. PATENT DOCUMENTS 10,931,311 B2 * 2/2021 Kim .................... H03M 13/13
2018/0278272 A1 * 9/2018 Li .................... H03M 13/2906
2018/0331697 A1 * 11/2018 Lin .................... H04L 1/0057
2018/0331699 A1 * 11/2018 Lin .................... H04L 1/0072
2019/0123860 A1 4/2019 Xu et al.
2019/0326934 A1 * 10/2019 Kim .................... H04L 1/08

(Continued)

FOREIGN PATENT DOCUMENTS

WO WO 2017/176309 10/2017
WO WO 2019/211674 11/2019

OTHER PUBLICATIONS

Futurewei, "Alignment of EN-DC/NE-DC parameter names," 3GPP TSG-RAN WG1 Meeting #105-e, R1-2106343, e-Meeting, May 19-27, 2021, 56 pages.

(Continued)

*Primary Examiner* — Mujtaba M Chaudry
(74) *Attorney, Agent, or Firm* — Fish & Richardson P.C.

(57) ABSTRACT

A method by which a first wireless device transmits a signal on the basis of a hybrid automatic repeat request (HARQ) in a wireless communication system, according to one embodiment of the present specification, comprises the steps of: generating a first codeword on the basis of a first polar code; transmitting the first codeword; generating a second codeword on the basis of a second polar code; and transmitting the second codeword.

6 Claims, 17 Drawing Sheets

(56) References Cited

U.S. PATENT DOCUMENTS

| | | | | |
|---|---|---|---|---|
| 2020/0007160 | A1* | 1/2020 | Li | H03M 13/2906 |
| 2020/0067532 | A1 | 2/2020 | Zhang et al. | |
| 2020/0287659 | A1* | 9/2020 | Ye | H04L 1/0057 |
| 2021/0050865 | A1* | 2/2021 | Li | H04L 1/0057 |
| 2021/0099213 | A1* | 4/2021 | Chen | H04L 1/0009 |

OTHER PUBLICATIONS

Extended European Search Report in European Appln. No. 21949407.7, mailed on Mar. 28, 2025, 12 pages.

Huawei, HiSilicon, "HARQ scheme for polar codes," R1-1611255, 3GPP TSG RAN WG1 Meeting #87, Reno, USA, Nov. 14-18, 2016, 25 pages.

Huawei, HiSilicon, "IR-HARQ scheme for polar codes," R1-1700406, 3GPP TSG RAN WG1 NR Ad-Hoc Meeting, Spokane, USA, Jan. 16-20, 2017, 4 pages.

ZTE, ZTE Microelectronics, "HARQ Performance of Rate-compatible Polar codes," R1-1613267, 3GPP TSG RAN WG1 #87, Reno, US, Nov. 14-18, 2016, 8 pages.

* cited by examiner

FIG. 12
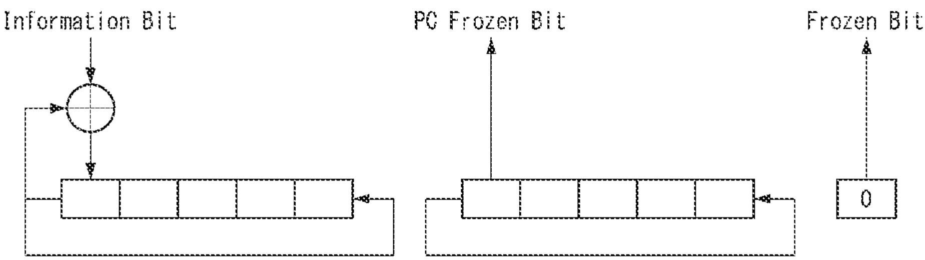
FIG. 13
| | | | | | | | | | | | | | | | | | |
|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 13a |
| Rel | 0 | 1 | 2 | 4 | 8 | 3 | 5 | 6 | 9 | 10 | 12 | 7 | 11 | 13 | 14 | 15 | 13b |
| 1st Tx | | | | u0 | | u1 | u2 | u3 | u4 | u5 | u6 | u7 | u8 | u9 | u10 | u11 | 13c |
| 2nd Tx | | | | | | | | u0 | | | | u1 | u2 | u4 | u5 | u6 | 13d |
FIG. 14
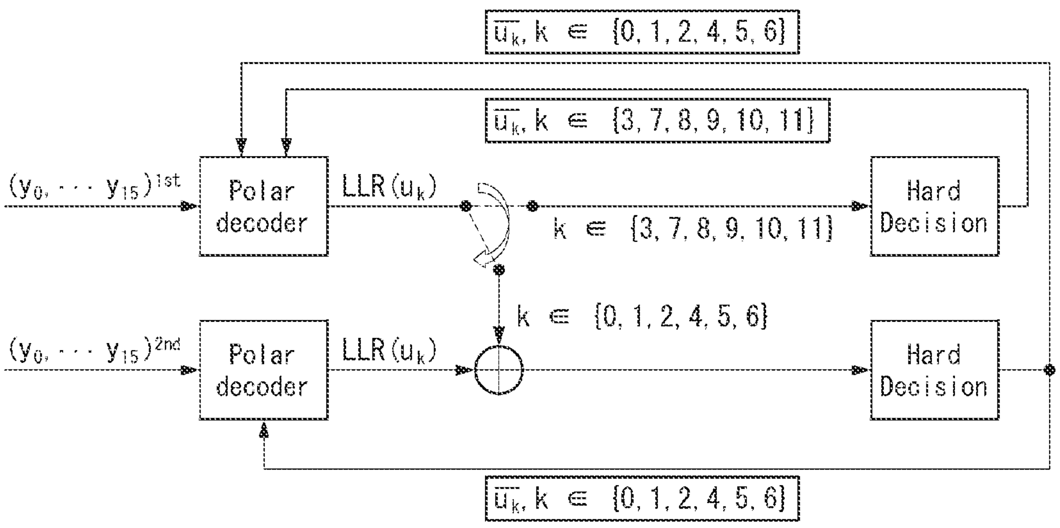

FIG. 15

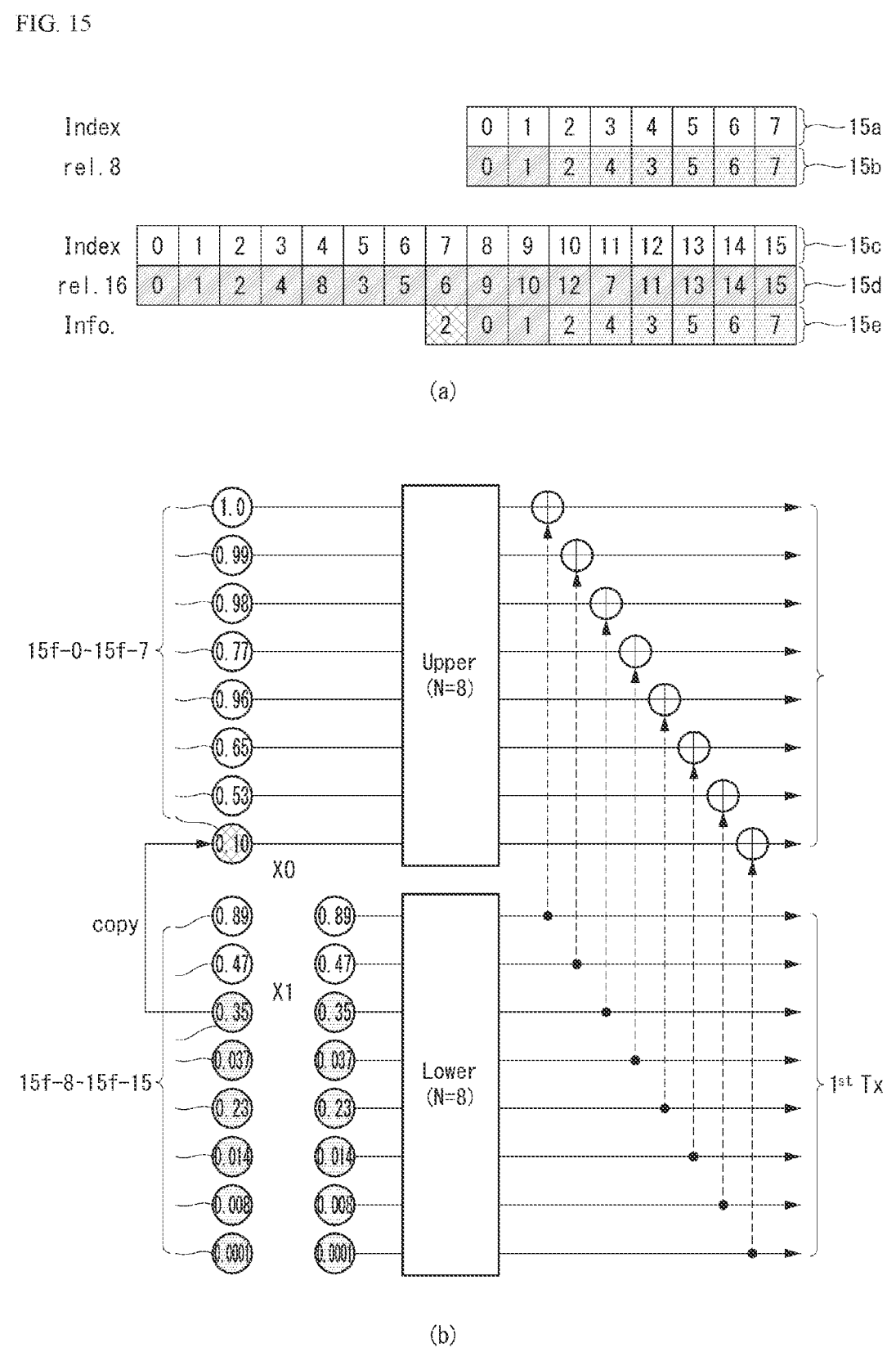

| Index | 0 | 1 | 2 | 3 | 4 | 5 | 6 | 7 |
|---|---|---|---|---|---|---|---|---|
| rel. 8 | 0 | 1 | 2 | 4 | 3 | 5 | 6 | 7 |

15a, 15b

| Index | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| rel. 16 | 0 | 1 | 2 | 4 | 8 | 3 | 5 | 6 | 9 | 10 | 12 | 7 | 11 | 13 | 14 | 15 |
| Info. | | | | | | | | 2 | 0 | 1 | 2 | 4 | 3 | 5 | 6 | 7 |

| 31 | 30 | 29 | 27 | 23 | 15 | 28 | 22 | 25 | 26 | 21 | 14 | 13 | 19 | 11 | 7 | 24 | 20 | 12 | 18 | 10 | 17 | 6 | 9 | 5 | 3 | 16 | 8 | 4 | 2 | 1 | 0 |
|---|---|---|---|---|---|---|---|---|---|---|---|---|---|---|---|---|---|---|---|---|---|---|---|---|---|---|---|---|---|---|---|

(b)

| 63 | 62 | 61 | 59 | 55 | 47 | 31 | 60 | 58 | 57 | 54 | 53 | 46 | 51 | 45 | 30 | 43 | 29 | 39 | 27 | 56 | 23 | 52 | 15 | 50 | 44 | 49 | 42 | 28 | 41 | 38 | 22 | 25 | 37 | 26 | 35 | 21 | 14 | 48 | 13 | 19 | 40 | 11 | 7 | 36 | 24 | 34 | 20 | 33 | 12 | 18 | 10 | 17 | 6 | 9 | 5 | 3 | 32 | 16 | 8 | 4 | 2 | 1 | 0 |
|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|

FIG. 17

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| 17b | | | | | | | | | | | | | | | | | | | | | | | | | | | | | | | | |
| 17c | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |

| 17a | 32 | 33 | 34 | 35 | 36 | 37 | 38 | 39 | 40 | 41 | 42 | 43 | 44 | 45 | 46 | 47 | 48 | 49 | 50 | 51 | 52 | 53 | 54 | 55 | 56 | 57 | 58 | 59 | 60 | 61 | 62 | 63 |
|---|---|---|---|---|---|---|---|---|---|---|---|---|---|---|---|---|---|---|---|---|---|---|---|---|---|---|---|---|---|---|---|---|
| 17b | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | u0 | u1 | u2 |
| 17c | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | u0 | u1 | u2 |

FIG. 18

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| 18b | | | | | | | | | | | | | | | | | | | | | | | | | | | | | | | | |
| 18c | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | u3 |

| | 32 | 33 | 34 | 35 | 36 | 37 | 38 | 39 | 40 | 41 | 42 | 43 | 44 | 45 | 46 | 47 | 48 | 49 | 50 | 51 | 52 | 53 | 54 | 55 | 56 | 57 | 58 | 59 | 60 | 61 | 62 | 63 |
|---|---|---|---|---|---|---|---|---|---|---|---|---|---|---|---|---|---|---|---|---|---|---|---|---|---|---|---|---|---|---|---|---|
| 18b | 0 | 0 | 0 | 0 | 0 | 0 | 0 | 0 | 0 | 0 | 0 | 0 | 0 | 0 | 0 | u0 | 0 | 0 | 0 | 0 | 0 | 0 | 0 | u1 | 0 | 0 | 0 | 0 | u3 | u4 | u5 | u6 |
| 18c | 0 | 0 | 0 | 0 | 0 | 0 | 0 | 0 | 0 | 0 | 0 | 0 | 0 | 0 | 0 | u0 | 0 | 0 | 0 | 0 | 0 | 0 | 0 | u1 | 0 | 0 | 0 | 0 | u3 | u4 | u5 | u6 |

| | | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|
| 20a | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| 20b | | | | | | | | | | | | | | | | | | | | | | | | | | | | | | | | |
| 20c | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | u0 |

| | | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|
| 20a | 32 | 33 | 34 | 35 | 36 | 37 | 38 | 39 | 40 | 41 | 42 | 43 | 44 | 45 | 46 | 47 | 48 | 49 | 50 | 51 | 52 | 53 | 54 | 55 | 56 | 57 | 58 | 59 | 60 | 61 | 62 | 63 |
| 20b | 0 | 0 | 0 | 0 | 0 | 0 | 0 | u0 | 0 | 0 | 0 | u1 | u2 | u3 | u4 | u5 | 0 | 0 | u6 | u7 | u8 | u9 | u10 | u11 | 0 | 0 | 0 | 0 | 0 | 0 | 0 | 0 |
| 20c | 0 | 0 | 0 | 0 | 0 | 0 | 0 | 0 | 0 | 0 | 0 | 0 | 0 | 0 | 0 | u1 | 0 | 0 | 0 | 0 | 0 | u2 | u3 | u4 | 0 | u5 | u6 | u7 | u8 | u9 | u10 | u11 |

FIG. 21

| 21a | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| 21b | | | | | | | | | | | | | | | | | | | | | | | | | | | | | | | | |
| 21c | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | u2 | u6 | u8 |

| 21a | 32 | 33 | 34 | 35 | 36 | 37 | 38 | 39 | 40 | 41 | 42 | 43 | 44 | 45 | 46 | 47 | 48 | 49 | 50 | 51 | 52 | 53 | 54 | 55 | 56 | 57 | 58 | 59 | 60 | 61 | 62 | 63 |
|---|---|---|---|---|---|---|---|---|---|---|---|---|---|---|---|---|---|---|---|---|---|---|---|---|---|---|---|---|---|---|---|---|
| 21b | 0 | 0 | 0 | 0 | 0 | 0 | 0 | u0 | 0 | 0 | 0 | u1 | u2 | u3 | u4 | u5 | 0 | 0 | u6 | u7 | u8 | u9 | u10 | u11 | 0 | 0 | 0 | 0 | 0 | 0 | 0 | 0 |
| 21c | 0 | 0 | 0 | 0 | 0 | 0 | 0 | u0 | 0 | 0 | 0 | u1 | u2 | u3 | u4 | u5 | 0 | 0 | u6 | u7 | u8 | u9 | u10 | u11 | 0 | 0 | 0 | 0 | 0 | 0 | 0 | 0 |

FIG. 22

| | | | | | | | | | | | | | | | | |
|---|---|---|---|---|---|---|---|---|---|---|---|---|---|---|---|---|
| 22a | 0 | 1 | 2 | 3 | 4 | 5 | 6 | 7 | 8 | 9 | 10 | 11 | 12 | 13 | 14 | 15 |
| 22b | 0 | 0 | 0 | 0 | 0 | 0 | 0 | 0 | 0 | 0 | 0 | 0 | 0 | 0 | 0 | 0 |

| | | | | | | | | | | | | | | | | |
|---|---|---|---|---|---|---|---|---|---|---|---|---|---|---|---|---|
| 22a | 16 | 17 | 18 | 19 | 20 | 21 | 22 | 23 | 24 | 25 | 26 | 27 | 28 | 29 | 30 | 31 |
| 22b | 0 | 0 | 0 | 0 | 0 | 0 | 0 | 0 | 0 | 0 | 0 | 0 | 0 | 0 | 0 | 0 |

| | | | | | | | | | | | | | | | | |
|---|---|---|---|---|---|---|---|---|---|---|---|---|---|---|---|---|
| 22a | 32 | 33 | 34 | 35 | 36 | 37 | 38 | 39 | 40 | 41 | 42 | 43 | 44 | 45 | 46 | 47 |
| 22b | 0 | 0 | 0 | 0 | 0 | 0 | 0 | 0 | 0 | 0 | 0 | 0 | 0 | 0 | u0 | u1 |

| | | | | | | | | | | | | | | | | |
|---|---|---|---|---|---|---|---|---|---|---|---|---|---|---|---|---|
| 22a | 48 | 49 | 50 | 51 | 52 | 53 | 54 | 55 | 56 | 57 | 58 | 59 | 60 | 61 | 62 | 63 |
| 22b | 0 | 0 | 0 | 0 | 0 | u2 | u3 | u4 | 0 | u5 | u6 | u7 | u8 | u9 | u10 | u11 |

METHOD FOR TRANSMITTING SIGNAL ON BASIS OF HARQ IN WIRELESS COMMUNICATION SYSTEM, AND APPARATUS THEREFOR

CROSS-REFERENCE TO RELATED APPLICATIONS

This application is a National Stage application under 35 U.S.C. § 371 of International Application No. PCT/KR2021/008512, filed on Jul. 5, 2021. The disclosure of the prior application is incorporated by reference in its entirety.

TECHNICAL FIELD

The present disclosure relates to a method for transmitting a signal based on HARQ in a wireless communication system, and an apparatus therefor.

BACKGROUND

Mobile communication systems have been developed to provide voice services, while ensuring activity of users. However, coverage of the mobile communication systems has been extended up to data services, as well as voice service, and currently, an explosive increase in traffic has caused shortage of resources, and since users expect relatively high speed services, an advanced mobile communication system is required.

Requirements of a next-generation mobile communication system include accommodation of explosive data traffic, a significant increase in a transfer rate per user, accommodation of considerably increased number of connection devices, very low end-to-end latency, and high energy efficiency. To this end, there have been researched various technologies such as dual connectivity, massive multiple input multiple output (MIMO), in-band full duplex, non-orthogonal multiple access (NOMA), super wideband, device networking, and the like.

SUMMARY

The present disclosure proposes a method for transmitting a signal based on HARQ, and an apparatus therefor. Polar code is used only for transmission of control data in the NR standard and does not support HARQ. It is necessary to support HARQ in order to use the polar code for data transmission in the 6G system In the case of the Incremental Freezing (IF) HARQ method, the bit channel index allocated to the data bit changes. Because of this, combining the codeword received based on retransmission and the codeword received based on first transmission is possible after decoding the codeword received based on the retransmission.

In the case of the Incremental Redundancy (IR) HARQ method, when a retransmitted codeword is received, combining operation is possible without decoding the codeword. Therefore, IF HARQ does not improve system performance significantly compared to IR HARQ.

Meanwhile, in order to support IR HARQ, the characteristic that the codeword generated for first transmission must be included in the codeword generated for the retransmission must be satisfied. In this regard, the size of the polar code (mother code size) for the retransmission may be different from the size of the polar code used for first transmission. In this case, since the data bits are allocated to bit channel indices determined in an order according to the reliability of the polar encoder, a problem may occur in which the codeword generated for first transmission is not included in the codeword generated for the retransmission.

The present disclosure proposes a method to solve the above-mentioned problems in supporting IR HARQ based on polar code.

Additionally, when a shortening operation is applied to codeword generation for initial transmission, in the allocation of data bits to the bit channel index of the polar encoder, a problem occurs in which IR-HARQ cannot be supported because the allocation of the initial transmission and the allocation of the retransmission are different.

The present disclosure proposes a method for supporting IR-HARQ based on polar codes by considering the rate matching operation (puncturing/shortening/repetition) applied to initial transmission.

The technical objects of the present disclosure are not limited to the aforementioned technical objects, and other technical objects, which are not mentioned above, will be apparently appreciated by a person having ordinary skill in the art from the following description.

A method for transmitting a signal based on Hybrid Automatic Repeat reQuest (HARQ) by a first wireless device in a wireless communication system according to an embodiment of the present disclosure, the method comprises generating a first codeword based on a first polar code, transmitting the first codeword, generating a second codeword based on a second polar code, and transmitting the second codeword.

The transmission of the second codeword is related to retransmission of the first codeword, a size of the second polar code is $2^n$ times a size of the first polar code, and n is an integer greater than or equal to 0.

The size of the second polar code is determined based on one or more first bit channel indices allocated to a data block related to the first codeword among bit channel indices of the first polar code.

One or more second bit channel indices among bit channel indices of the second polar code are allocated to the data block related to the first codeword.

The one or more second bit channel indices i) include the one or more first bit channel indices, or ii) include bit channel indices obtained by adding a first specific value to the one or more first bit channel indices.

The first specific value may be based on a difference value between the size of the second polar code and the size of the first polar code.

Based on the one or more first bit channel indices including a certain number or more of bit channel indices belonging to a lower polar subcode of the first polar code, the size of the second polar code may be determined to be greater than the size of the first polar code.

The one or more second bit channel indices may be based on one or more specific bit channel indices determined based on an order of a reliability related to a polar encoder and a size of the data block related to the first codeword.

Based on the one or more specific bit channel indices including one or more bit channel indices belonging to a lower polar subcode of the second polar code, the one or more second bit channel indices may be determined as bit channel indices according to ii) above through a copy operation.

The copy operation may be performed based on the size of the data block being greater than or equal to a second specific value related to the second polar code. The second specific value may be determined based on a ranking of a bit channel index with a highest value of a reliability among the bit channel indices belonging to the lower polar subcode of the second polar code. The ranking may be defined in order according to a value of the reliability within a range of all bit channel indices of the second polar code.

Based on a size of the data block being less than or equal to a third specific value, the size of the first polar code and the size of the second polar code may be the same, and the one or more second bit channel indices may include the one or more first bit channel indices.

Based on the one or more second bit channel indices including bit channel indices obtained by adding a specific value to the one or more first bit channel indices, 1) based on a coding rate of the first codeword being greater than a value related to a shortening for a rate matching, the first codeword may be generated based on the shortening or a puncturing, and 2) based on the first codeword being generated based on the shortening, a bit value for at least one bit channel indices related to the shortening among the bit channel indices of the second polar code in the second codeword may be configured to 0.

The shortening or the puncturing may be applied based on the size of the first codeword not being a multiple of 2.

When the first codeword is generated based on the shortening, the one or more second bit channel indices may include bit channel indices determined in order according to a value of a reliability in a range excluding at least one bit channel indices related to the shortening among the bit channel indices of the second polar code.

Based on the first codeword being generated based on the puncturing, and based on the size of the first codeword being greater than a preconfigured value, the size of the first polar code may be based on twice the preconfigured value, and the preconfigured value may be based on a smallest value among sizes of a polar code predetermined in relation to the generation of the first codeword.

The one or more first bit channel indices may include bit channel indices determined in order according to a value of a reliability in a range excluding at least one bit channel indices related to the puncturing among the bit channel indices of the first polar code.

A first wireless device transmitting a signal based on Hybrid Automatic Repeat reQuest (HARQ) in a wireless communication system, according to another embodiment of the present disclosure, the first wireless device comprises one or more transceivers, one or more processors controlling the one or more transceivers, and one or more memories operably connected to the one or more processors, and storing instructions that configure the one or more processors to perform operations when being executed by the one or more processors.

The operations includes generating a first codeword based on a first polar code, transmitting the first codeword, generating a second codeword based on a second polar code, and transmitting the second codeword.

The transmission of the second codeword is related to retransmission of the first codeword, a size of the second polar code is $2^n$ times a size of the first polar code, and n is an integer greater than or equal to 0.

The size of the second polar code is determined based on one or more first bit channel indices allocated to a data block related to the first codeword among bit channel indices of the first polar code.

One or more second bit channel indices among bit channel indices of the second polar code are allocated to the data block related to the first codeword.

The one or more second bit channel indices i) include the one or more first bit channel indices, or ii) include bit channel indices obtained by adding a first specific value to the one or more first bit channel indices.

The first wireless device may be based on a user equipment (UE) or a base station (BS).

A device according to another embodiment of the present disclosure comprises one or more memories and one or more processors functionally connected to the one or more memories.

The one or more memories store instructions that configure the one or more processors to perform operations when being executed by the one or more processors.

The operations includes generating a first codeword based on a first polar code, transmitting the first codeword, generating a second codeword based on a second polar code, and transmitting the second codeword.

The transmission of the second codeword is related to retransmission of the first codeword, a size of the second polar code is $2^n$ times a size of the first polar code, and n is an integer greater than or equal to 0.

The size of the second polar code is determined based on one or more first bit channel indices allocated to a data block related to the first codeword among bit channel indices of the first polar code.

One or more second bit channel indices among bit channel indices of the second polar code are allocated to the data block related to the first codeword.

The one or more second bit channel indices i) include the one or more first bit channel indices, or ii) include bit channel indices obtained by adding a first specific value to the one or more first bit channel indices.

One or more non-transitory computer-readable medium according to another embodiment of the present disclosure stores one or more instructions.

The one or more instructions configure the one or more processors to perform operations when being executed by the one or more processors:

The operations includes generating a first codeword based on a first polar code, transmitting the first codeword, generating a second codeword based on a second polar code, and transmitting the second codeword.

The transmission of the second codeword is related to retransmission of the first codeword, a size of the second polar code is $2^n$ times a size of the first polar code, and n is an integer greater than or equal to 0.

The size of the second polar code is determined based on one or more first bit channel indices allocated to a data block related to the first codeword among bit channel indices of the first polar code.

One or more second bit channel indices among bit channel indices of the second polar code are allocated to the data block related to the first codeword.

The one or more second bit channel indices i) include the one or more first bit channel indices, or ii) include bit channel indices obtained by adding a first specific value to the one or more first bit channel indices.

According to an embodiment of the present disclosure, the second codeword related to retransmission of the first codeword is generated based on the second polar code. At this time, the bit channel indices of the second polar code allocated to the data block of the first codeword may be based on one or more second bit channel indices. The one or more second bit channel indices i) may include the one or more first bit channel indices related to the first codeword, or ii) may include bit channel indices obtained by adding a first specific value to the one or more first bit channel indices.

Since the characteristics for supporting IR HARQ are met as described above, IR HARQ based on polar code can be supported in a wireless communication system. Additionally, since IR HARQ based on polar code can be used for data transmission, system performance can be improved in terms of reliability.

In addition, according to the IR HARQ method based on the polar code, since the received bits are immediately combined without decoding, the performance of the polar code-based HARQ operation can be further improved compared to the existing IF-HARQ method.

According to an embodiment of the present disclosure, the one or more second bit channel indices may be based on one or more specific bit channel indices determined based on the order of reliability related to a polar encoder and the size of the data block related to the first codeword. Based on the one or more specific bit channel indices including one or more bit channel indices belonging to a lower polar subcode of the second polar code, the one or more second bit channel indices may be determined as bit channel indices according to ii) above through a copy operation.

As described above, cases in which a copy operation must be performed to support IR HARQ can be specifically defined. According to an embodiment of the present disclosure, since the copy operation is performed only when the characteristics for support of IR HARQ are not met according to the basic operation related to polar encoding, operation efficiency can be improved when generating codewords for retransmission.

According to an embodiment of the present disclosure, when shortening or puncturing is applied to initial transmission, the one or more second bit channel indices related to retransmission may be determined to include the following bit channels. Specifically, among the bit channel indices of the second polar code, bit channel indices determined in order according to a value of reliability in a range excluding at least one bit channel indices related to the corresponding operation (shortening/puncturing) may be included in the one or more second bit channel indices.

Therefore, even when shortening or puncturing is applied to the initial transmission, combining the retransmission codeword and the initial transmission codeword is possible. That is, polar code-based HARQ can be supported regardless of the type of operation applied for rate matching.

The effects that can be obtained from the present disclosure are not limited to the effects mentioned above, and other effects not mentioned will be clearly understood by those skilled in the art from the description below.

BRIEF DESCRIPTION OF THE DRAWINGS

The accompanying drawings are provided to help understanding of the present disclosure, and may provide embodiments of the present disclosure together with a detailed description. However, the technical features of the present disclosure are not limited to specific drawings, and the features disclosed in each drawing may be combined with each other to constitute a new embodiment. Reference numerals in each drawing may refer to structural elements.

FIG. 12 is a diagram for explaining generation of a parity check bit according to an embodiment of the present disclosure.

FIG. 13 illustrates a polar encoding operation performed to support IF-HARQ according to an embodiment of the present disclosure.

FIG. 14 illustrates a receiver structure supporting IF-HARQ according to an embodiment of the present disclosure.

FIG. 15 is a diagram for explaining an encoding operation related to incremental redundancy according to an embodiment of the present disclosure.

FIG. 16 illustrates bit channel indices rearranged in order of a reliability of a bit channel according to an embodiment of the present disclosure.

FIG. 17 is a diagram illustrating data arranged in a polar encoder based on a specific data block size when an operation related to a rate matching is not performed according to an embodiment of the present disclosure.

FIG. 18 is a diagram illustrating data arranged in a polar encoder based on a specific data block size when an operation related to a rate matching is not performed according to an embodiment of the present disclosure.

FIG. 20 is a diagram illustrating data arranged in a polar encoder based on a specific data block size when a shortening is performed according to an embodiment of the present disclosure.

FIG. 21 is a diagram illustrating data arranged in a polar encoder to support IR-HARQ when a shortening is performed in an initial transmission according to an embodiment of the present disclosure.

FIG. 22 is a diagram for explaining an operation in which a codeword is generated using puncturing instead of shortening in the first transmission according to an embodiment of the present disclosure.

DETAILED DESCRIPTION

Figure 1:
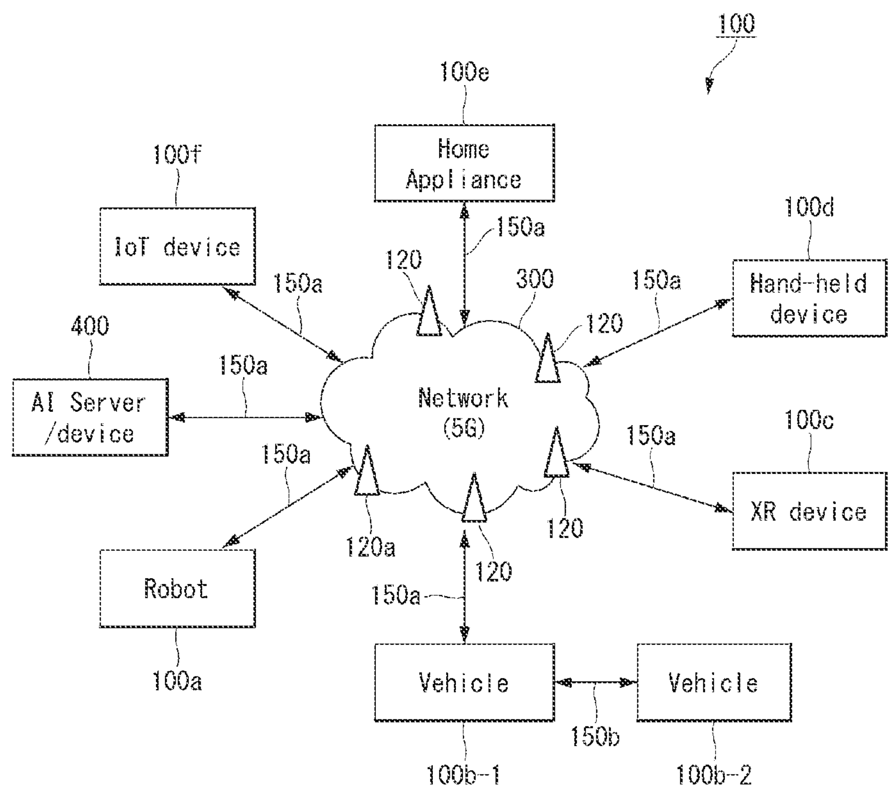
FIG. 1 is a view showing an example of a communication system applicable to the present disclosure.

The embodiments of the present disclosure described below are combinations of elements and features of the present disclosure in specific forms. The elements or features may be considered selective unless otherwise mentioned. Each element or feature may be practiced without being combined with other elements or features. Further, an embodiment of the present disclosure may be constructed by combining parts of the elements and/or features. Operation orders described in embodiments of the present disclosure may be rearranged. Some constructions or elements of any one embodiment may be included in another embodiment and may be replaced with corresponding constructions or features of another embodiment.

In the description of the drawings, procedures or steps which render the scope of the present disclosure unnecessarily ambiguous will be omitted and procedures or steps which can be understood by those skilled in the art will be omitted.

Throughout the specification, when a certain portion "includes" or "comprises" a certain component, this indicates that other components are not excluded and may be further included unless otherwise noted. The terms "unit", "-or/er" and "module" described in the specification indicate a unit for processing at least one function or operation, which may be implemented by hardware, software or a combination thereof. In addition, the terms "a or an", "one", "the" etc. may include a singular representation and a plural representation in the context of the present disclosure (more particularly, in the context of the following claims) unless indicated otherwise in the specification or unless context clearly indicates otherwise.

In the embodiments of the present disclosure, a description is mainly made of a data transmission and reception relationship between a Base Station (BS) and a mobile station. A BS refers to a terminal node of a network, which directly communicates with a mobile station. A specific operation described as being performed by the BS may be performed by an upper node of the BS.

Namely, it is apparent that, in a network comprised of a plurality of network nodes including a BS, various operations performed for communication with a mobile station may be performed by the BS, or network nodes other than the BS. The term "BS" may be replaced with a fixed station, a Node B, an evolved Node B (eNode B or eNB), an Advanced Base Station (ABS), an access point, etc.

In the embodiments of the present disclosure, the term terminal may be replaced with a UE, a Mobile Station (MS), a Subscriber Station (SS), a Mobile Subscriber Station (MSS), a mobile terminal, an Advanced Mobile Station (AMS), etc.

A transmitter is a fixed and/or mobile node that provides a data service or a voice service and a receiver is a fixed and/or mobile node that receives a data service or a voice service. Therefore, a mobile station may serve as a transmitter and a BS may serve as a receiver, on an UpLink (UL). Likewise, the mobile station may serve as a receiver and the BS may serve as a transmitter, on a DownLink (DL).

The embodiments of the present disclosure may be supported by standard specifications disclosed for at least one of wireless access systems including an Institute of Electrical and Electronics Engineers (IEEE) 802.xx system, a 3rd Generation Partnership Project (3GPP) system, a 3GPP Long Term Evolution (LTE) system, 3GPP 5th generation (5G) new radio (NR) system, and a 3GPP2 system. In particular, the embodiments of the present disclosure may be supported by the standard specifications, 3GPP TS 36.211, 3GPP TS 36.212, 3GPP TS 36.213, 3GPP TS 36.321 and 3GPP TS 36.331.

In addition, the embodiments of the present disclosure are applicable to other radio access systems and are not limited to the above-described system. For example, the embodiments of the present disclosure are applicable to systems applied after a 3GPP 5G NR system and are not limited to a specific system.

That is, steps or parts that are not described to clarify the technical features of the present disclosure may be supported by those documents. Further, all terms as set forth herein may be explained by the standard documents.

Reference will now be made in detail to the embodiments of the present disclosure with reference to the accompanying drawings. The detailed description, which will be given below with reference to the accompanying drawings, is intended to explain exemplary embodiments of the present disclosure, rather than to show the only embodiments that can be implemented according to the disclosure.

The following detailed description includes specific terms in order to provide a thorough understanding of the present disclosure. However, it will be apparent to those skilled in the art that the specific terms may be replaced with other terms without departing the technical spirit and scope of the present disclosure.

The embodiments of the present disclosure can be applied to various radio access systems such as Code Division Multiple Access (CDMA), Frequency Division Multiple Access (FDMA), Time Division Multiple Access (TDMA), Orthogonal Frequency Division Multiple Access (OFDMA), Single Carrier Frequency Division Multiple Access (SC-FDMA), etc.

Hereinafter, in order to clarify the following description, a description is made based on a 3GPP communication system (e.g., LTE, NR, etc.), but the technical spirit of the present disclosure is not limited thereto. LTE may refer to technology after 3GPP TS 36.xxx Release 8. In detail, LTE technology after 3GPP TS 36.xxx Release 10 may be referred to as LTE-A, and LTE technology after 3GPP TS 36.xxx Release 13 may be referred to as LTE-A pro. 3GPP NR may refer to technology after TS 38.xxx Release 15. 3GPP 6G may refer to technology TS Release 17 and/or Release 18. "xxx" may refer to a detailed number of a standard document. LTE/NR/6G may be collectively referred to as a 3GPP system.

For background arts, terms, abbreviations, etc. used in the present disclosure, refer to matters described in the standard documents published prior to the present disclosure. For example, reference may be made to the standard documents 36.xxx and 38.xxx.

Communication System Applicable to the Present Disclosure

Without being limited thereto, various descriptions, functions, procedures, proposals, methods and/or operational flowcharts of the present disclosure disclosed herein are applicable to various fields requiring wireless communication/connection (e.g., 5G).

Hereinafter, a more detailed description will be given with reference to the drawings. In the following drawings/description, the same reference numerals may exemplify the same or corresponding hardware blocks, software blocks or functional blocks unless indicated otherwise.

FIG. 1 is a view showing an example of a communication system applicable to the present disclosure. Referring to FIG. 1, the communication system 100 applicable to the present disclosure includes a wireless device, a base station and a network. The wireless device refers to a device for performing communication using radio access technology (e.g., 5G NR or LTE) and may be referred to as a communication/wireless/5G device. Without being limited thereto, the wireless device may include a robot 100*a*, vehicles 100*b*-1 and 100*b*-2, an extended reality (XR) device 100*c*, a hand-held device 100*d*, a home appliance 100*e*, an Internet of Thing (IoT) device 100*f*, and an artificial intelligence (AI) device/server 100*g*. For example, the vehicles may include a vehicle having a wireless communication function, an autonomous vehicle, a vehicle capable of performing vehicle-to-vehicle communication, etc. The vehicles 100*b*-1 and 100*b*-2 may include an unmanned aerial vehicle (UAV) (e.g., a drone). The XR device 100*c* includes an augmented reality (AR)/virtual reality (VR)/mixed reality (MR) device and may be implemented in the form of a head-mounted device (HMD), a head-up display (HUD) provided in a vehicle, a television, a smartphone, a computer, a wearable device, a home appliance, a digital signage, a vehicle or a robot. The hand-held device 100*d* may include a smartphone, a smart pad, a wearable device (e.g., a smart watch or smart glasses), a computer (e.g., a laptop), etc. The home appliance 100*e* may include a TV, a refrigerator, a washing machine, etc. The IoT device 100*f* may include a sensor, a smart meter, etc. For example, the base station 120 and the network 130 may be implemented by a wireless device, and a specific wireless device 120*a* may operate as a base station/network node for another wireless device.

The wireless devices 100*a* to 100*f* may be connected to the network 130 through the base station 120. AI technology is applicable to the wireless devices 100*a* to 100*f*, and the wireless devices 100*a* to 100*f* may be connected to the AI server 100*g* through the network 130. The network 130 may be configured using a 3G network, a 4G (e.g., LTE) network or a 5G (e.g., NR) network, etc. The wireless devices 100*a* to 100*f* may communicate with each other through the base station 120/the network 130 or perform direct communication (e.g., sidelink communication) without through the base station 120/the network 130. For example, the vehicles 100*b*-1 and 100*b*-2 may perform direct communication (e.g., vehicle to vehicle (V2V)/vehicle to everything (V2X) communication). In addition, the IoT device 100*f* (e.g., a sensor) may perform direct communication with another IoT device (e.g., a sensor) or the other wireless devices 100*a* to 100*f*.

Wireless communications/connections 150*a*, 150*b* and 150*c* may be established between the wireless devices 100*a* to 100*f*/the base station 120 and the base station 120/the base station 120. Here, wireless communication/connection may be established through various radio access technologies (e.g., 5G NR) such as uplink/downlink communication 150*a*, sidelink communication 150*b* (or D2D communication) or communication 150*c* between base stations (e.g., relay, integrated access backhaul (IAB). The wireless device and the base station/wireless device or the base station and the base station may transmit/receive radio signals to/from each other through wireless communication/connection 150*a*, 150*b* and 150*c*. For example, wireless communication/connection 150*a*, 150*b* and 150*c* may enable signal transmission/reception through various physical channels. To this end, based on the various proposals of the present disclosure, at least some of various configuration information setting processes for transmission/reception of radio signals, various signal processing procedures (e.g., channel encoding/decoding, modulation/demodulation, resource mapping/demapping, etc.), resource allocation processes, etc. may be performed.

Communication System Applicable to the Present Disclosure

Figure 2:
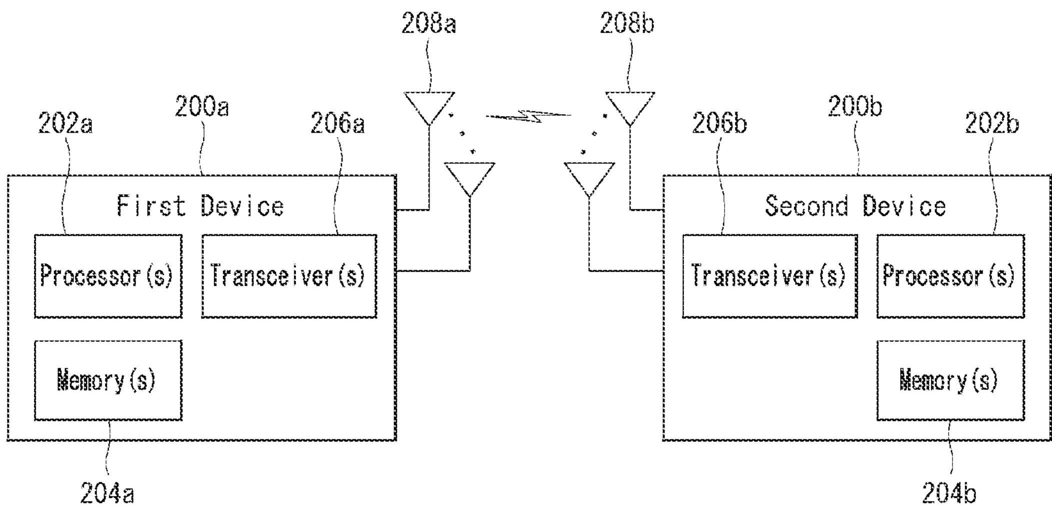
FIG. 2 is a view showing an example of a wireless apparatus applicable to the present disclosure.

FIG. 2 is a view showing an example of a wireless device applicable to the present disclosure.

Referring to FIG. 2, a first wireless device 200*a* and a second wireless device 200*b* may transmit and receive radio signals through various radio access technologies (e.g., LTE or NR). Here, {the first wireless device 200*a*, the second wireless device 200*b*} may correspond to {the wireless device 100*x*, the base station 120} and/or {the wireless device 100*x*, the wireless device 100*x*} of FIG. 1.

The first wireless device 200*a* may include one or more processors 202*a* and one or more memories 204*a* and may further include one or more transceivers 206*a* and/or one or more antennas 208*a*. The processor 202*a* may be configured to control the memory 204*a* and/or the transceiver 206*a* and to implement descriptions, functions, procedures, proposals, methods and/or operational flowcharts disclosed herein. For example, the processor 202*a* may process information in the memory 204*a* to generate first information/signal and then transmit a radio signal including the first information/signal through the transceiver 206*a*. In addition, the processor 202*a* may receive a radio signal including second information/signal through the transceiver 206*a* and then store information obtained from signal processing of the second information/signal in the memory 204*a*. The memory 204*a* may be connected with the processor 202*a*, and store a variety of information related to operation of the processor 202*a*. For example, the memory 204*a* may store software code including instructions for performing all or some of the processes controlled by the processor 202*a* or performing the descriptions, functions, procedures, proposals, methods and/or operational flowcharts disclosed herein. Here, the processor 202*a* and the memory 204*a* may be part of a communication modem/circuit/chip designed to implement wireless communication technology (e.g., LTE or NR). The transceiver 206*a* may be connected with the processor 202*a* to transmit and/or receive radio signals through one or more antennas 208*a*. The transceiver 206*a* may include a transmitter and/or a receiver. The transceiver 206*a* may be used interchangeably with a radio frequency (RF) unit. In the present disclosure, the wireless device may refer to a communication modem/circuit/chip.

The second wireless device 200*b* may include one or more processors 202*b* and one or more memories 204*b* and may further include one or more transceivers 206*b* and/or one or more antennas 208*b*. The processor 202*b* may be configured to control the memory 204*b* and/or the transceiver 206*b* and to implement the descriptions, functions, procedures, proposals, methods and/or operational flowcharts disclosed herein. For example, the processor 202*b* may process information in the memory 204*b* to generate third information/signal and then transmit the third information/signal through the transceiver 206*b*. In addition, the processor 202*b* may receive a radio signal including fourth information/signal through the transceiver 206*b* and then store information obtained from signal processing of the fourth information/signal in the memory 204*b*. The memory 204*b* may be connected with the processor 202*b* to store a variety of information related to operation of the processor 202*b*. For example, the memory 204*b* may store software code including instructions for performing all or some of the processes controlled by the processor 202*b* or performing the descriptions, functions, procedures, proposals, methods and/or operational flowcharts disclosed herein. Herein, the processor 202*b* and the memory 204*b* may be part of a communication modem/circuit/chip designed to implement wireless communication technology (e.g., LTE or NR). The transceiver 206*b* may be connected with the processor 202*b* to transmit and/or receive radio signals through one or more antennas 208*b*. The transceiver 206*b* may include a transmitter and/or a receiver. The transceiver 206*b* may be used interchangeably with a radio frequency (RF) unit. In the present disclosure, the wireless device may refer to a communication modem/circuit/chip.

Hereinafter, hardware elements of the wireless devices 200*a* and 200*b* will be described in greater detail. Without being limited thereto, one or more protocol layers may be implemented by one or more processors 202*a* and 202*b*. For example, one or more processors 202*a* and 202*b* may implement one or more layers (e.g., functional layers such as PHY (physical), MAC. (media access control), RLC (radio link control), PDCP (packet data convergence protocol), RRC (radio resource control), SDAP (service data adaptation protocol)). One or more processors 202*a* and 202*b* may generate one or more protocol data units (PDUs) and/or one or more service data unit (SDU) according to the descriptions, functions, procedures, proposals, methods and/or operational flowcharts disclosed herein. One or more processors 202*a* and 202*b* may generate messages, control information, data or information according to the descriptions, functions, procedures, proposals, methods and/or operational flowcharts disclosed herein. One or more processors 202*a* and 202*b* may generate PDUs, SDUs, messages, control information, data or information according to the functions, procedures, proposals and/or methods disclosed herein and provide the PDUs, SDUs, messages, control information, data or information to one or more transceivers 206*a* and 206*b*. One or more processors 202*a* and 202*b* may receive signals (e.g., baseband signals) from one or more transceivers 206*a* and 206*b* and acquire PDUs, SDUs, messages, control information, data or information according to the descriptions, functions, procedures, proposals, methods and/or operational flowcharts disclosed herein.

One or more processors 202*a* and 202*b* may be referred to as controllers, microcontrollers, microprocessors or microcomputers. One or more processors 202*a* and 202*b* may be implemented by hardware, firmware, software or a combination thereof. For example, one or more application specific integrated circuits (ASICs), one or more digital signal processors (DSPs), one or more digital signal processing devices (DSPDs), programmable logic devices (PLDs) or one or more field programmable gate arrays (FPGAs) may be included in one or more processors 202*a* and 202*b*. The descriptions, functions, procedures, proposals, methods and/or operational flowcharts disclosed herein may be implemented using firmware or software, and firmware or software may be implemented to include modules, procedures, functions, etc. Firmware or software configured to perform the descriptions, functions, procedures, proposals, methods and/or operational flowcharts disclosed herein may be included in one or more processors 202*a* and 202*b* or stored in one or more memories 204*a* and 204*b* to be driven by one or more processors 202*a* and 202*b*. The descriptions, functions, procedures, proposals, methods and/or operational flowcharts disclosed herein implemented using firmware or software in the form of code, a command and/or a set of commands.

One or more memories 204*a* and 204*b* may be connected with one or more processors 202*a* and 202*b* to store various types of data, signals, messages, information, programs, code, instructions and/or commands. One or more memories 204*a* and 204*b* may be composed of read only memories (ROMs), random access memories (RAMs), erasable programmable read only memories (EPROMs), flash memories, hard drives, registers, cache memories, computer-readable storage mediums and/or combinations thereof. One or more memories 204*a* and 204*b* may be located inside and/or outside one or more processors 202*a* and 202*b*. In addition, one or more memories 204*a* and 204*b* may be connected with one or more processors 202*a* and 202*b* through various technologies such as wired or wireless connection.

One or more transceivers 206*a* and 206*b* may transmit user data, control information, radio signals/channels, etc. described in the methods and/or operational flowcharts of the present disclosure to one or more other apparatuses. One or more transceivers 206*a* and 206*b* may receive user data, control information, radio signals/channels, etc. described in the methods and/or operational flowcharts of the present disclosure from one or more other apparatuses. For example, one or more transceivers 206*a* and 206*b* may be connected with one or more processors 202*a* and 202*b* to transmit/receive radio signals. For example, one or more processors 202*a* and 202*b* may perform control such that one or more transceivers 206*a* and 206*b* transmit user data, control information or radio signals to one or more other apparatuses. In addition, one or more processors 202*a* and 202*b* may perform control such that one or more transceivers 206*a* and 206*b* receive user data, control information or radio signals from one or more other apparatuses. In addition, one or more transceivers 206*a* and 206*b* may be connected with one or more antennas 208*a* and 208*b*, and one or more transceivers 206*a* and 206*b* may be configured to transmit/receive user data, control information, radio signals/channels, etc. described in the descriptions, functions, procedures, proposals, methods and/or operational flowcharts disclosed herein through one or more antennas 208*a* and 208*b*. In the present disclosure, one or more antennas may be a plurality of physical antennas or a plurality of logical antennas (e.g., antenna ports). One or more transceivers 206*a* and 206*b* may convert the received radio signals/channels, etc. from RF band signals to baseband signals, in order to process the received user data, control information, radio signals/channels, etc. using one or more processors 202*a* and 202*b*. One or more transceivers 206*a* and 206*b* may convert the user data, control information, radio signals/channels processed using one or more processors 202*a* and 202*b* from baseband signals into RF band signals. To this end, one or more transceivers 206*a* and 206*b* may include (analog) oscillator and/or filters.

Structure of Wireless Device Applicable to the Present Disclosure

Figure 3:
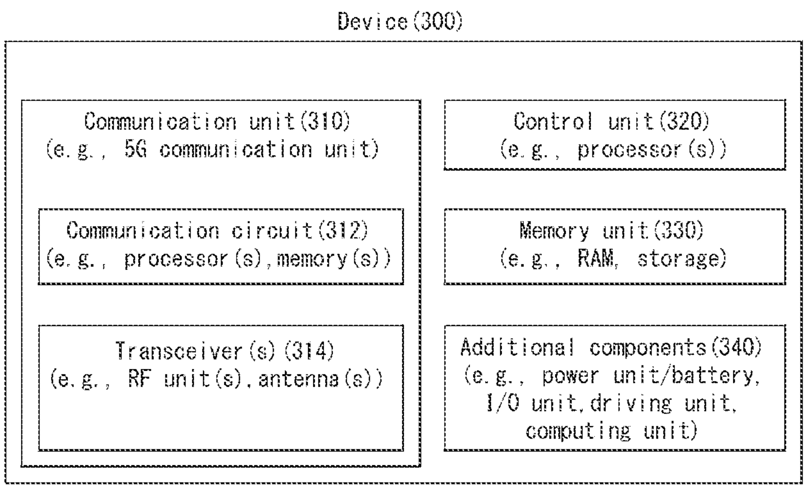
FIG. 3 is a view showing another example of a wireless device applicable to the present disclosure.

FIG. 3 is a view showing another example of a wireless device applicable to the present disclosure.

Referring to FIG. 3, a wireless device 300 may correspond to the wireless devices 200*a* and 200*b* of FIG. 2 and include various elements, components, units/portions and/or modules. For example, the wireless device 300 may include a communication unit 310, a control unit (controller) 320, a memory unit (memory) 330 and additional components 340. The communication unit may include a communication circuit 312 and a transceiver(s) 314. For example, the communication circuit 312 may include one or more processors 202*a* and 202*b* and/or one or more memories 204*a* and 204*b* of FIG. 2. For example, the transceiver(s) 314 may include one or more transceivers 206*a* and 206*b* and/or one or more antennas 208*a* and 208*b* of FIG. 2. The control unit 320 may be electrically connected with the communication unit 310, the memory unit 330 and the additional components 340 to control overall operation of the wireless device. For example, the control unit 320 may control electrical/mechanical operation of the wireless device based on a program/code/instruction/information stored in the memory unit 330. In addition, the control unit 320 may transmit the information stored in the memory unit 330 to the outside (e.g., another communication device) through the wireless/wired interface using the communication unit 310 over a wireless/wired interface or store information received from the outside (e.g., another communication device) through the wireless/wired interface using the communication unit 310 in the memory unit 330.

The additional components 340 may be variously configured according to the types of the wireless devices. For example, the additional components 340 may include at least one of a power unit/battery, an input/output unit, a driving unit or a computing unit. Without being limited thereto, the wireless device 300 may be implemented in the form of the robot (FIG. 1, 100*a*), the vehicles (FIGS. 1, 100*b*-1 and 100*b*-2), the XR device (FIG. 1, 100*c*), the hand-held device (FIG. 1, 100*d*), the home appliance (FIG. 1, 100*e*), the IoT device (FIG. 1, 100*f*), a digital broadcast terminal, a hologram apparatus, a public safety apparatus, an MTC apparatus, a medical apparatus, a Fintech device (financial device), a security device, a climate/environment device, an AI server/device (FIG. 1, 140), the base station (FIG. 1, 120), a network node, etc. The wireless device may be movable or may be used at a fixed place according to use example/service.

In FIG. 3, various elements, components, units/portions and/or modules in the wireless device 300 may be connected with each other through wired interfaces or at least some thereof may be wirelessly connected through the communication unit 310. For example, in the wireless device 300, the control unit 320 and the communication unit 310 may be connected by wire, and the control unit 320 and the first unit (e.g., 130 or 140) may be wirelessly connected through the communication unit 310. In addition, each element, component, unit/portion and/or module of the wireless device 300 may further include one or more elements. For example, the control unit 320 may be composed of a set of one or more processors. For example, the control unit 320 may be composed of a set of a communication control processor, an application processor, an electronic control unit (ECU), a graphic processing processor, a memory control processor, etc. In another example, the memory unit 330 may be composed of a random access memory (RAM), a dynamic RAM (DRAM), a read only memory (ROM), a flash memory, a volatile memory, a non-volatile memory and/or a combination thereof.

Hand-Held Device Applicable to the Present Disclosure

Figure 4:
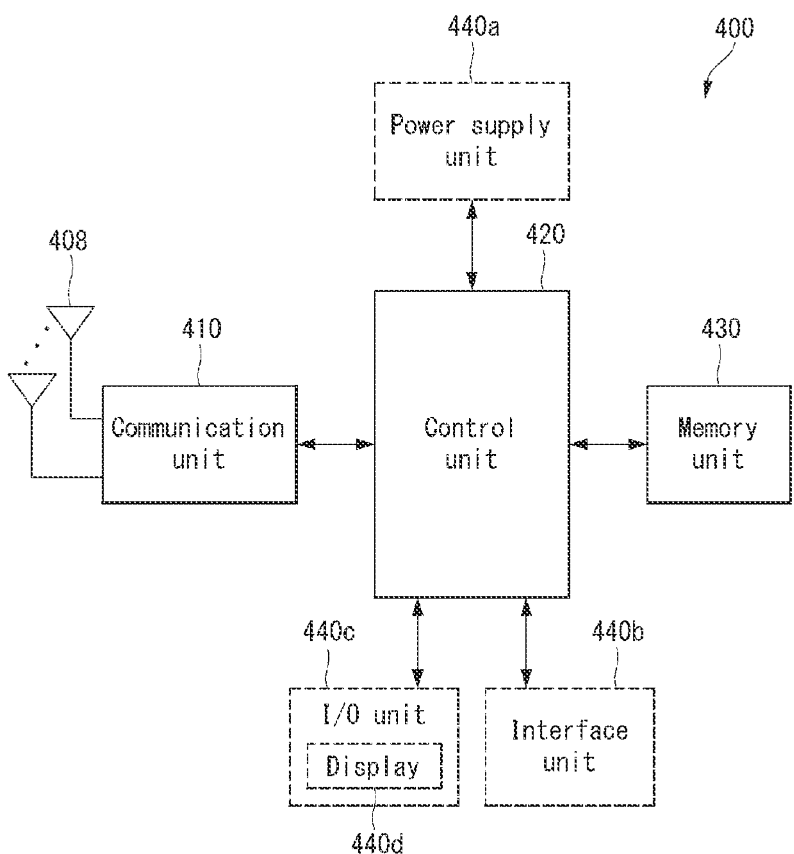
FIG. 4 is a view showing an example of a hand-held device applicable to the present disclosure.

FIG. 4 is a view showing an example of a hand-held device applicable to the present disclosure.

FIG. 4 shows a hand-held device applicable to the present disclosure. The hand-held device may include a smartphone, a smart pad, a wearable device (e.g., a smart watch or smart glasses), and a hand-held computer (e.g., a laptop, etc.). The hand-held device may be referred to as a mobile station (MS), a user terminal (UT), a mobile subscriber station (MSS), a subscriber station (SS), an advanced mobile station (AMS) or a wireless terminal (WT).

Referring to FIG. 4, the hand-held device 400 may include an antenna unit (antenna) 408, a communication unit (transceiver) 410, a control unit (controller) 420, a memory unit (memory) 430, a power supply unit (power supply) 440*a*, an interface unit (interface) 440*b*, and an input/output unit 440*c*. An antenna unit (antenna) 408 may be part of the communication unit 410. The blocks 410 to 430/440*a* to 440*c* may correspond to the blocks 310 to 330/340 of FIG. 3, respectively.

The communication unit 410 may transmit and receive signals (e.g., data, control signals, etc.) to and from other wireless devices or base stations. The control unit 420 may control the components of the hand-held device 400 to perform various operations. The control unit 420 may include an application processor (AP). The memory unit 430 may store data/parameters/program/code/instructions necessary to drive the hand-held device 400. In addition, the memory unit 430 may store input/output data/information, etc. The power supply unit 440*a* may supply power to the hand-held device 400 and include a wired/wireless charging circuit, a battery, etc. The interface unit 440*b* may support connection between the hand-held device 400 and another external device. The interface unit 440*b* may include various ports (e.g., an audio input/output port and a video input/output port) for connection with the external device. The input/output unit 440*c* may receive or output video information/signals, audio information/signals, data and/or user input information. The input/output unit 440*c* may include a camera, a microphone, a user input unit, a display 440*d*, a speaker and/or a haptic module.

For example, in case of data communication, the input/output unit 440*c* may acquire user input information/signal (e.g., touch, text, voice, image or video) from the user and store the user input information/signal in the memory unit 430. The communication unit 410 may convert the information/signal stored in the memory into a radio signal and transmit the converted radio signal to another wireless device directly or transmit the converted radio signal to a base station. In addition, the communication unit 410 may receive a radio signal from another wireless device or the base station and then restore the received radio signal into original information/signal. The restored information/signal may be stored in the memory unit 430 and then output through the input/output unit 440*c* in various forms (e.g., text, voice, image, video and haptic).

Physical Channels and General Signal Transmission

In a radio access system, a UE receives information from a base station on a DL and transmits information to the base station on a UL. The information transmitted and received between the UE and the base station includes general data information and a variety of control information. There are many physical channels according to the types/usages of information transmitted and received between the base station and the UE.

Figure 5:
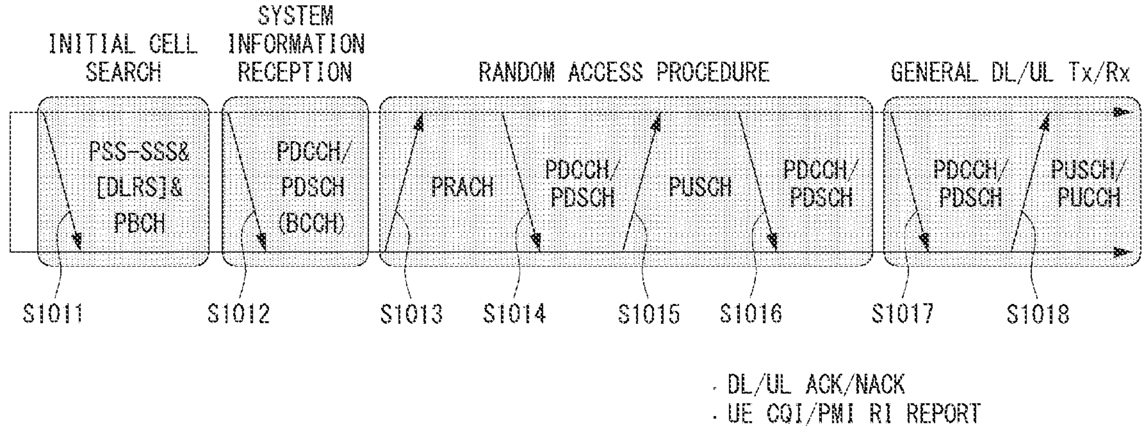
FIG. 5 is a view showing physical channels applicable to the present disclosure and a signal transmission method using the same.

FIG. 5 is a view showing physical channels applicable to the present disclosure and a signal transmission method using the same.

The UE which is turned on again in a state of being turned off or has newly entered a cell performs initial cell search operation in step S1011 such as acquisition of synchronization with a base station. Specifically, the UE performs synchronization with the base station, by receiving a Primary Synchronization Channel (P-SCH) and a Secondary Synchronization Channel (S-SCH) from the base station, and acquires information such as a cell Identifier (ID).

Thereafter, the UE may receive a physical broadcast channel (PBCH) signal from the base station and acquire intra-cell broadcast information. Meanwhile, the UE may receive a downlink reference signal (DL RS) in an initial cell search step and check a downlink channel state. The UE which has completed initial cell search may receive a physical downlink control channel (PDCCH) and a physical downlink control channel (PDSCH) according to physical downlink control channel information in step S1012, thereby acquiring more detailed system information.

Thereafter, the UE may perform a random access procedure such as steps S1013 to S1016 in order to complete access to the base station. To this end, the UE may transmit a preamble through a physical random access channel (PRACH) (S1013) and receive a random access response (RAR) to the preamble through a physical downlink control channel and a physical downlink shared channel corresponding thereto (S1014). The UE may transmit a physical uplink shared channel (PUSCH) using scheduling information in the RAR (S1015) and perform a contention resolution procedure such as reception of a physical downlink control channel signal and a physical downlink shared channel signal corresponding thereto (S1016).

The UE, which has performed the above-described procedures, may perform reception of a physical downlink control channel signal and/or a physical downlink shared channel signal (S1017) and transmission of a physical uplink shared channel (PUSCH) signal and/or a physical uplink control channel (PUCCH) signal (S1018) as general uplink/downlink signal transmission procedures.

The control information transmitted from the UE to the base station is collectively referred to as uplink control information (UCI). The UCI includes hybrid automatic repeat and request acknowledgement/negative-ACK (HARQ-ACK/NACK), scheduling request (SR), channel quality indication (CQI), precoding matrix indication (PMI), rank indication (RI), beam indication (BI) information, etc. At this time, the UCI is generally periodically transmitted through a PUCCH, but may be transmitted through a PUSCH in some embodiments (e.g., when control information and traffic data are simultaneously transmitted). In addition, the UE may aperiodically transmit UCI through a PUSCH according to a request/instruction of a network.

Figure 6:
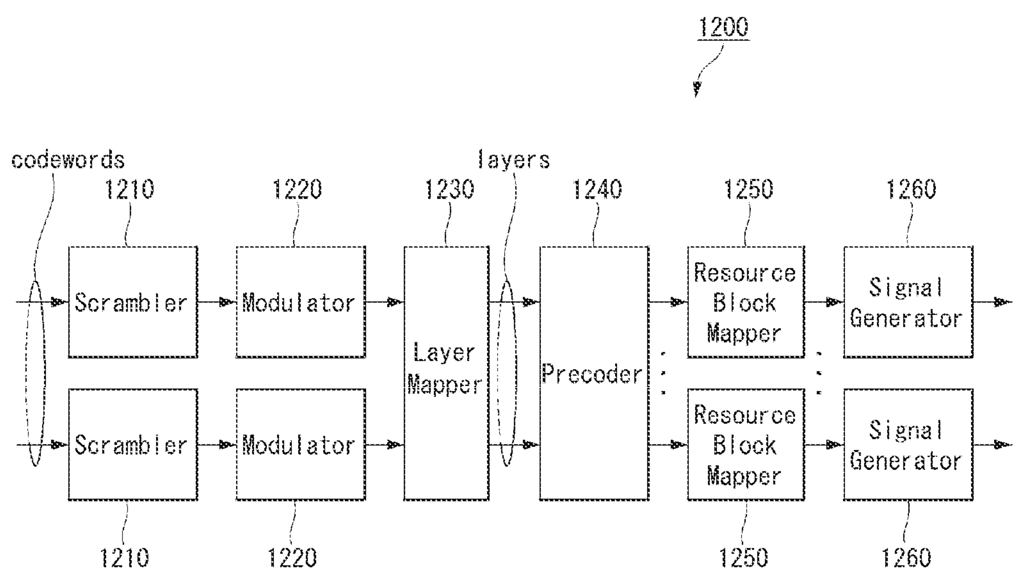
FIG. 6 is a view showing a method of processing a transmitted signal applicable to the present disclosure.

FIG. 6 is a view showing a method of processing a transmitted signal applicable to the present disclosure. For example, the transmitted signal may be processed by a signal processing circuit. At this time, a signal processing circuit 1200 may include a scrambler 1210, a modulator 1220, a layer mapper 1230, a precoder 1240, a resource mapper 1250, and a signal generator 1260. At this time, for example, the operation/function of FIG. 6 may be performed by the processors 202*a* and 202*b* and/or the transceiver 206*a* and 206*b* of FIG. 2. In addition, for example, the hardware element of FIG. 6 may be implemented in the processors 202*a* and 202*b* of FIG. 2 and/or the transceivers 206*a* and 206*b* of FIG. 2. For example, blocks 1010 to 1060 may be implemented in the processors 202*a* and 202*b* of FIG. 2. In addition, blocks 1210 to 1250 may be implemented in the processors 202*a* and 202*b* of FIG. 2 and a block 1260 may be implemented in the transceivers 206*a* and 206*b* of FIG. 2, without being limited to the above-described embodiments.

A codeword may be converted into a radio signal through the signal processing circuit 1200 of FIG. 6. Here, the codeword is a coded bit sequence of an information block. The information block may include a transport block (e.g., a UL-SCH transport block or a DL-SCH transport block). The radio signal may be transmitted through various physical channels (e.g., a PUSCH and a PDSCH) of FIG. 5. Specifically, the codeword may be converted into a bit sequence scrambled by the scrambler 1210. The scramble sequence used for scramble is generated based in an initial value and the initial value may include ID information of a wireless device, etc. The scrambled bit sequence may be modulated into a modulated symbol sequence by the modulator 1220. The modulation method may include pi/2-binary phase shift keying (pi/2-BPSK), m-phase shift keying (m-PSK), m-quadrature amplitude modulation (m-QAM), etc.

A complex modulation symbol sequence may be mapped to one or more transport layer by the layer mapper 1230. Modulation symbols of each transport layer may be mapped to corresponding antenna port(s) by the precoder 1240 (precoding). The output z of the precoder 1240 may be obtained by multiplying the output y of the layer mapper 1230 by an N*M precoding matrix W. Here, N may be the number of antenna ports and M may be the number of transport layers. Here, the precoder 1240 may perform precoding after transform precoding (e.g., discrete Fourier transform (DFT)) for complex modulation symbols. In addition, the precoder 1240 may perform precoding without performing transform precoding.

The resource mapper 1250 may map modulation symbols of each antenna port to time-frequency resources. The time-frequency resources may include a plurality of symbols (e.g., a CP-OFDMA symbol and a DFT-s-OFDMA symbol) in the time domain and include a plurality of subcarriers in the frequency domain. The signal generator 1260 may generate a radio signal from the mapped modulation symbols, and the generated radio signal may be transmitted to another device through each antenna. To this end, the signal generator 1260 may include an inverse fast Fourier transform (IFFT) module, a cyclic prefix (CP) insertor, a digital-to-analog converter (DAC), a frequency uplink converter, etc.

A signal processing procedure for a received signal in the wireless device may be configured as the inverse of the signal processing procedures 1210 to 1260 of FIG. 6. For example, the wireless device (e.g., 200*a* or 200*b* of FIG. 2) may receive a radio signal from the outside through an antenna port/transceiver. The received radio signal may be converted into a baseband signal through a signal restorer. To this end, the signal restorer may include a frequency downlink converter, an analog-to-digital converter (ADC), a CP remover, and a fast Fourier transform (FFT) module. Thereafter, the baseband signal may be restored to a codeword through a resource de-mapper process, a postcoding process, a demodulation process and a de-scrambling process. The codeword may be restored to an original information block through decoding. Accordingly, a signal processing circuit (not shown) for a received signal may include a signal restorer, a resource de-mapper, a postcoder, a demodulator, a de-scrambler and a decoder.

Figure 7:
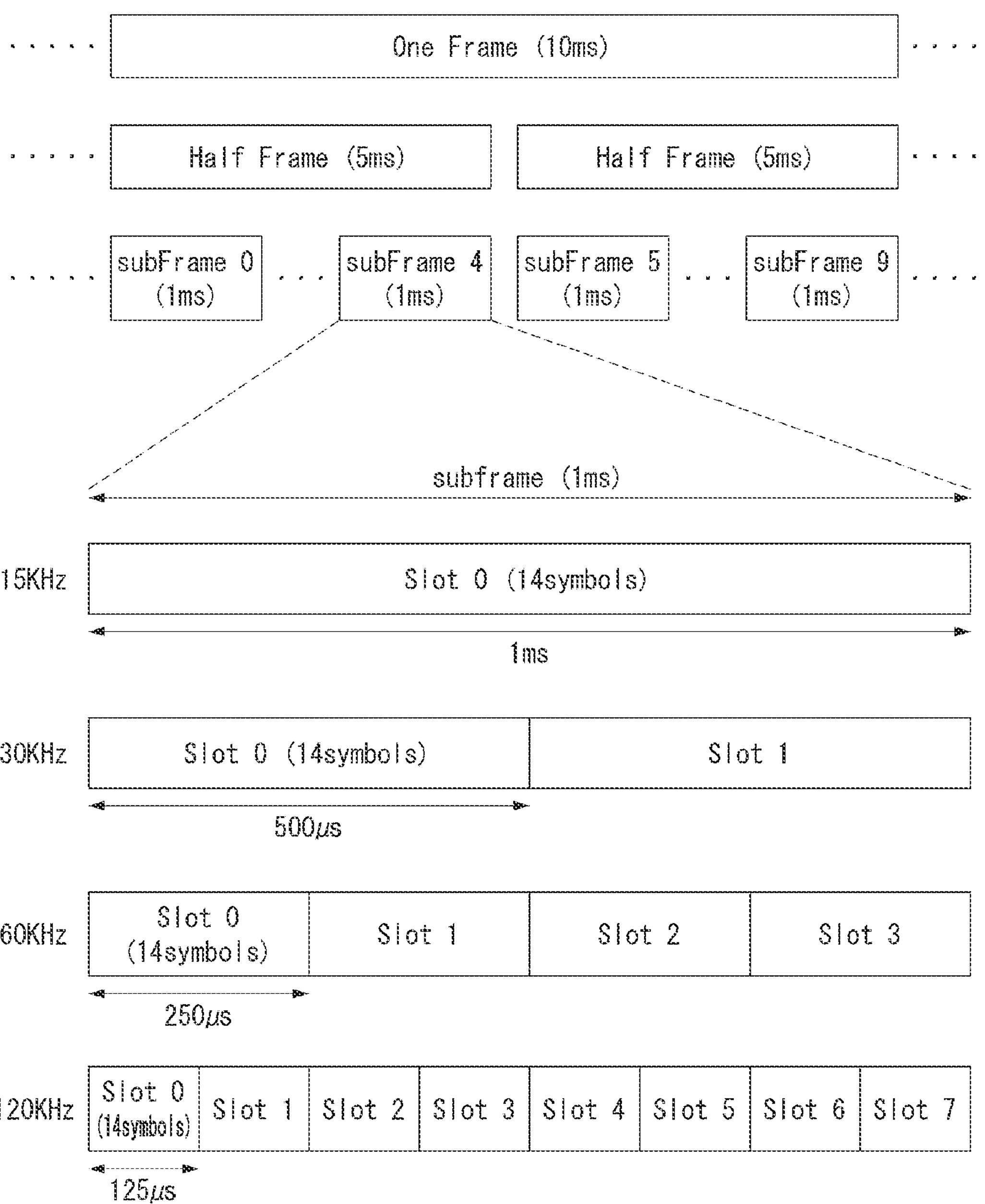
FIG. 7 is a view showing the structure of a radio frame applicable to the present disclosure.

FIG. 7 is a view showing the structure of a radio frame applicable to the present disclosure.

UL and DL transmission based on an NR system may be based on the frame shown in FIG. 7. At this time, one radio frame has a length of 10 ms and may be defined as two 5-ms half-frames (HFs). One half-frame may be defined as five 1-ms subframes (SFs). One subframe may be divided into one or more slots and the number of slots in the subframe may depend on subscriber spacing (SCS). At this time, each slot may include 12 or 14 OFDM (A) symbols according to cyclic prefix (CP). If normal CP is used, each slot may include 14 symbols. If an extended CP is used, each slot may include 12 symbols. Here, the symbol may include an OFDM symbol (or a CP-OFDM symbol) and an SC-FDMA symbol (or a DFT-s-OFDM symbol).

Table 1 shows the number of symbols per slot according to SCS, the number of slots per frame and the number of slots per subframe when normal CP is used, and Table 2 shows the number of symbols per slot according to SCS, the number of slots per frame and the number of slots per subframe when extended CP is used.

TABLE 1

| μ | $N_{symb}^{slot}$ | $N_{slot}^{frame,\mu}$ | $N_{slot}^{subframe,\mu}$ |
|---|---|---|---|
| 0 | 14 | 10 | 1 |
| 1 | 14 | 20 | 2 |
| 2 | 14 | 40 | 4 |
| 3 | 14 | 80 | 8 |
| 4 | 14 | 160 | 16 |
| 5 | 14 | 320 | 32 |

| μ | $N_{symb}^{slot}$ | $N_{slot}^{frame,\mu}$ | $N_{slot}^{subframe,\mu}$ |
|---|---|---|---|
| 2 | 12 | 40 | 4 |

In Tables 1 and 2 above, Nslotsymb may indicate the number of symbols in a slot, Nframe,μslot may indicate the number of slots in a frame, and Nsubframe,μslot may indicate the number of slots in a subframe.

In addition, in a system, to which the present disclosure is applicable, OFDM (A) numerology (e.g., SCS, CP length, etc.) may be differently set among a plurality of cells merged to one UE. Accordingly, an (absolute time) period of a time resource (e.g., an SF, a slot or a TTI) (for convenience, collectively referred to as a time unit (TU)) composed of the same number of symbols may be differently set between merged cells.

NR may support a plurality of numerologies (or subscriber spacings (SCSs)) supporting various 5G services. For example, a wide area in traditional cellular bands is supported when the SCS is 15 kHz, dense-urban, lower latency and wider carrier bandwidth are supported when the SCS is 30 kHz/60 kHz, and bandwidth greater than 24.25 GHz may be supported to overcome phase noise when the SCS is 60 kHz or higher.

An NR frequency band is defined as two types (FR1 and FR2) of frequency ranges. FR1 and FR2 may be configured as shown in the following table. In addition, FR2 may mean millimeter wave (mmW).

TABLE 3

| Frequency Range designation | Corresponding frequency range | Subcarrier Spacing |
|---|---|---|
| FR1 | 410 MHz-7125 MHz | 15, 30, 60 kHz |
| FR2 | 24250 MHz-52600 MHz | 60, 120, 240 kHz |

In addition, for example, in a communication system, to which the present disclosure is applicable, the above-described numerology may be differently set. For example, a terahertz wave (THz) band may be used as a frequency band higher than FR2. In the THz band, the SCS may be set greater than that of the NR system, and the number of slots may be differently set, without being limited to the above-described embodiments. The THz band will be described below.

Figure 8:
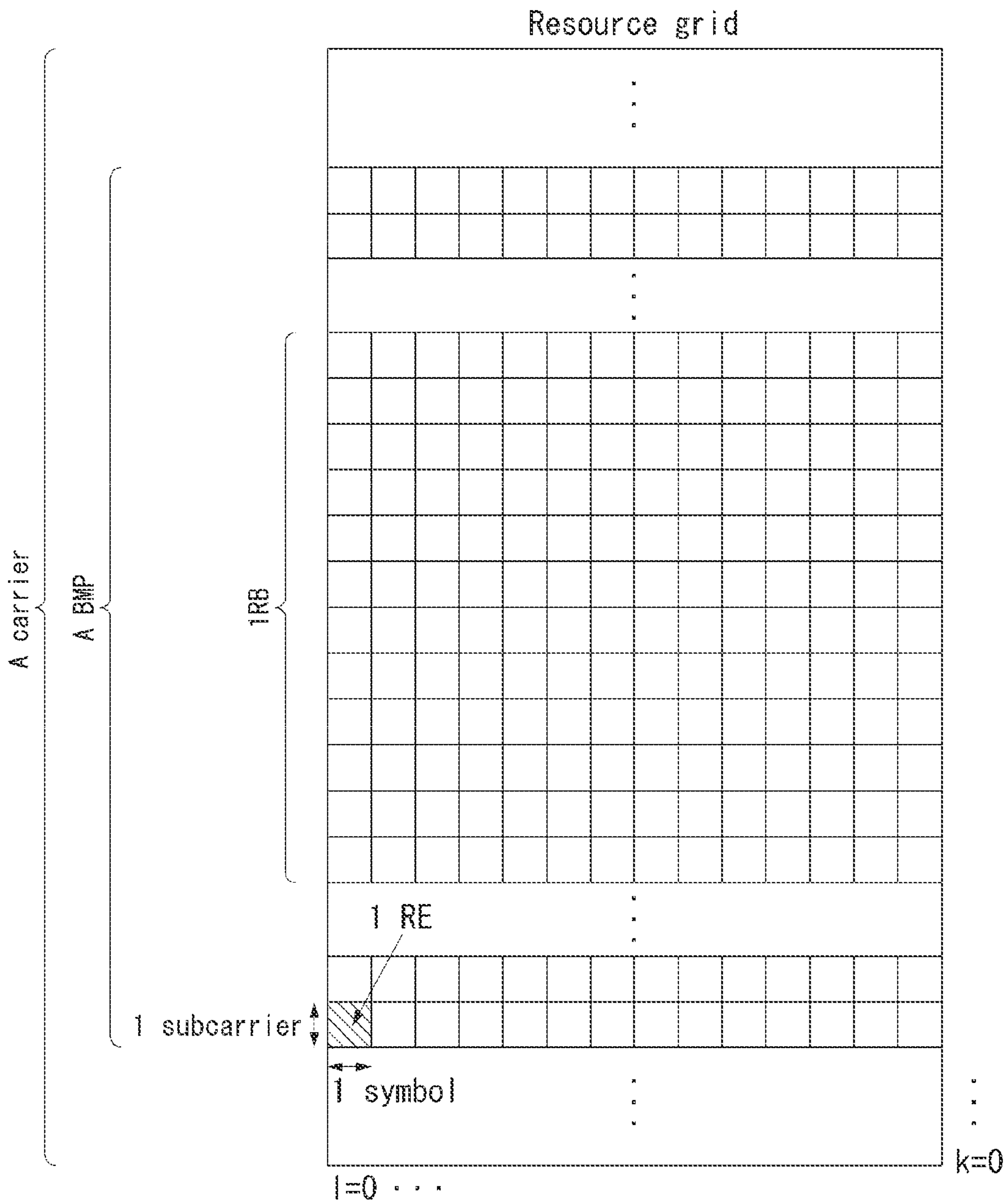
FIG. 8 is a view showing a slot structure applicable to the present disclosure.

FIG. 8 is a view showing a slot structure applicable to the present disclosure.

One slot includes a plurality of symbols in the time domain. For example, one slot includes seven symbols in case of normal CP and one slot includes six symbols in case of extended CP. A carrier includes a plurality of subcarriers in the frequency domain. A resource block (RB) may be defined as a plurality (e.g., 12) of consecutive subcarriers in the frequency domain.

In addition, a bandwidth part (BWP) is defined as a plurality of consecutive (P) RBs in the frequency domain and may correspond to one numerology (e.g., SCS, CP length, etc.).

The carrier may include a maximum of N (e.g., five) BWPs. Data communication is performed through an activated BWP and only one BWP may be activated for one UE. In resource grid, each element is referred to as a resource element (RE) and one complex symbol may be mapped.

6G Communication System

A 6G (wireless communication) system has purposes such as (i) very high data rate per device, (ii) a very large number of connected devices, (iii) global connectivity, (iv) very low latency, (v) decrease in energy consumption of battery-free IoT devices, (vi) ultra-reliable connectivity, and (vii) connected intelligence with machine learning capacity. The vision of the 6G system may include four aspects such as "intelligent connectivity", "deep connectivity", "holographic connectivity" and "ubiquitous connectivity", and the 6G system may satisfy the requirements shown in Table 4 below. That is, Table 4 shows the requirements of the 6G system.

TABLE 4

| | |
|---|---|
| Per device peak data rate | 1 Tbps |
| E2E latency | 1 ms |
| Maximum spectral efficiency | 100 bps/Hz |
| Mobility support | Up to 1000 km/hr |
| Satellite integration | Fully |
| AI | Fully |
| Autonomous vehicle | Fully |
| XR | Fully |
| Haptic Communication | Fully |

At this time, the 6G system may have key factors such as enhanced mobile broadband (eMBB), ultra-reliable low latency communications (URLLC), massive machine type communications (mMTC), AI integrated communication, tactile Internet, high throughput, high network capacity, high energy efficiency, low backhaul and access network congestion and enhanced data security.

Figure 9:
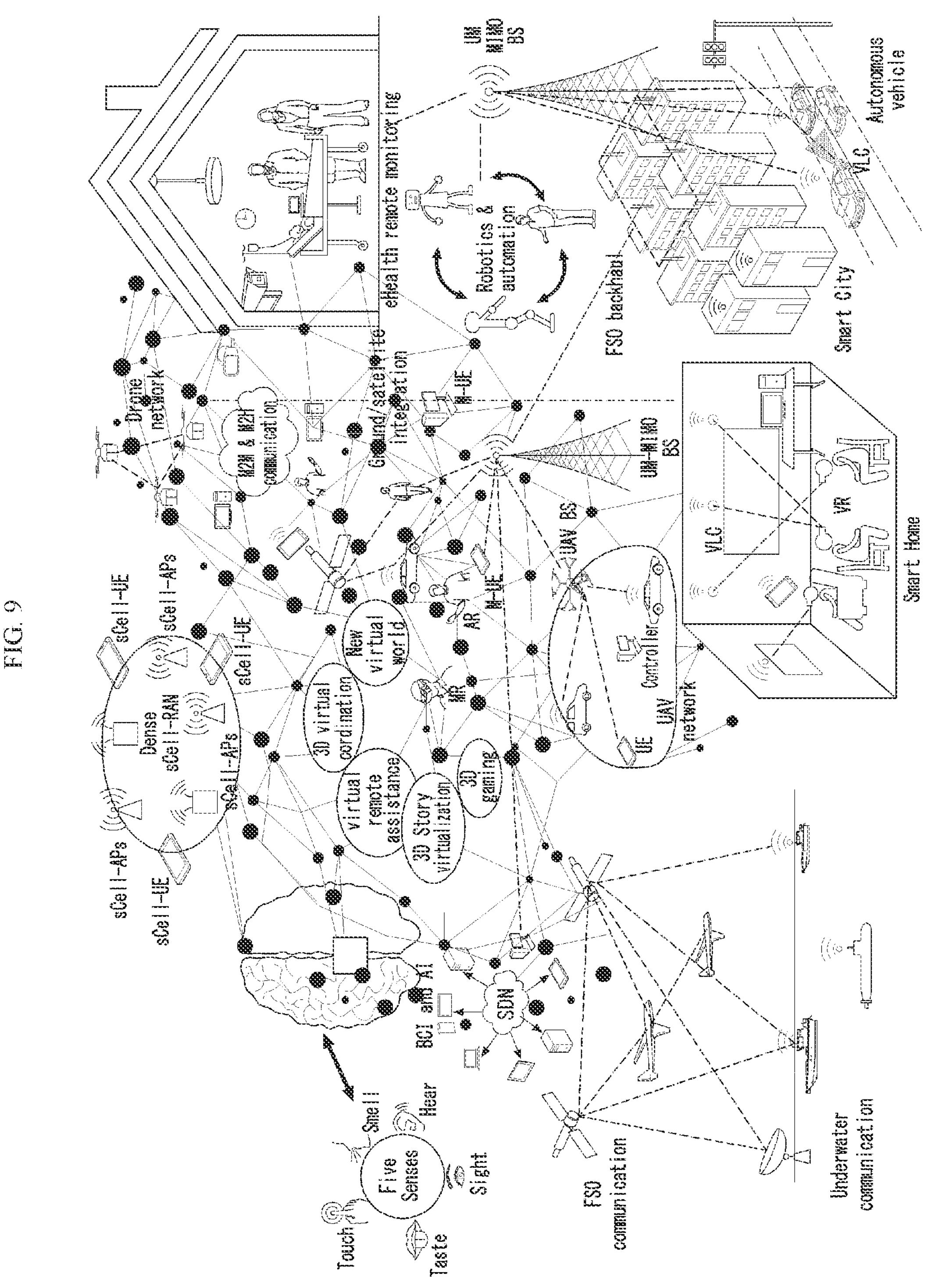
FIG. 9 is a view showing an example of a communication structure providable in a 6G system applicable to the present disclosure.

FIG. 9 is a view showing an example of a communication structure providable in a 6G system applicable to the present disclosure.

Referring to FIG. 9, the 6G system will have 50 times higher simultaneous wireless communication connectivity than a 5G wireless communication system. URLLC, which is the key feature of 5G, will become more important technology by providing end-to-end latency less than 1 ms in 6G communication. At this time, the 6G system may have much better volumetric spectrum efficiency unlike frequently used domain spectrum efficiency. The 6G system may provide advanced battery technology for energy harvesting and very long battery life and thus mobile devices may not need to be separately charged in the 6G system. In addition, in 6G, new network characteristics may be as follows.

Satellites integrated network: To provide a global mobile group, 6G will be integrated with satellite. Integrating terrestrial waves, satellites and public networks as one wireless communication system may be very important for 6G.

Connected intelligence: Unlike the wireless communication systems of previous generations, 6G is innovative and wireless evolution may be updated from "connected things" to "connected intelligence". AI may be applied in each step (or each signal processing procedure which will be described below) of a communication procedure.

Seamless integration of wireless information and energy transfer: A 6G wireless network may transfer power in order to charge the batteries of devices such as smartphones and sensors. Therefore, wireless information and energy transfer (WIET) will be integrated.

Ubiquitous super 3-dimension connectivity: Access to networks and core network functions of drones and very low earth orbit satellites will establish super 3D connection in 6G ubiquitous.

In the new network characteristics of 6G, several general requirements may be as follows.

Small cell networks: The idea of a small cell network was introduced in order to improve received signal quality as a result of throughput, energy efficiency and spectrum efficiency improvement in a cellular system. As a result, the small cell network is an essential feature for 5G and beyond 5G (5 GB) communication systems. Accordingly, the 6G communication system also employs the characteristics of the small cell network.

Ultra-dense heterogeneous network: Ultra-dense heterogeneous networks will be another important characteristic of the 6G communication system. A multi-tier network composed of heterogeneous networks improves overall QoS and reduce costs.

High-capacity backhaul: Backhaul connection is characterized by a high-capacity backhaul network in order to support high-capacity traffic. A high-speed optical fiber and free space optical (FSO) system may be a possible solution for this problem.

Radar technology integrated with mobile technology: High-precision localization (or location-based service) through communication is one of the functions of the 6G wireless communication system. Accordingly, the radar system will be integrated with the 6G network.

Softwarization and virtualization: Softwarization and virtualization are two important functions which are the bases of a design process in a 5 GB network in order to ensure flexibility, reconfigurability and programmability.

The contents discussed above may be applied in combination with the methods proposed in the present disclosure, which will be described later, or may be supplemented to clarify the technical features of the methods proposed in the present disclosure. The methods described below are divided for convenience of explanation, and it goes without saying that some components of one method may be replaced with some components of another method or may be applied in combination with each other.

Polar Code

Polar code is a code that can obtain channel capacity in a binary-input discrete memoryless channel (B-DMC). In other words, the polar code is a code that can obtain channel capacity by infinitely increasing N, the size of the code block. Here, 'obtaining channel capacity' may mean separating channels without noise and channels with noise. Polar code encoder consists of two processes: channel combining and channel splitting.

Channel combining is a process of determining the size of a code block by concatenating binary-input discrete memoryless channels (B-DMC) in parallel.

Figure 10:
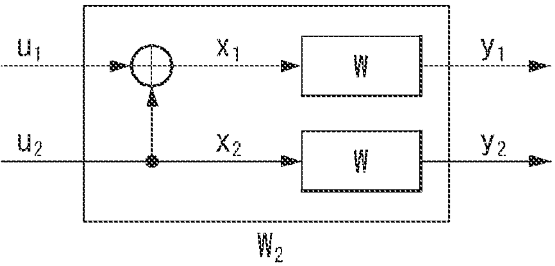
FIG. 10 is a diagram illustrating 1st level channel combining for polar coding according to an embodiment of the present disclosure.

FIG. 10 is a diagram illustrating 1st level channel combining for polar coding according to an embodiment of the present disclosure.

Referring to FIG. 10, two binary-input discrete memoryless channels (B-DMC) (W) are combined. Here, u1 and u2 are binary-input source bits and y1 and y2 are output coded bits. At this time, the entire equivalent channel is assumed to be W2. When N binary-input discrete memoryless channels (B-DMC) are combined, each channel can be expressed in a recursive form. That is, when $$x_1^N = u_1^N G_N,\ x_1^N = \{x_1, \ldots, x_N\}, \text{ and } u_1^N = \{u_1, \ldots, u_N\},$$

GN, which is a generator matrix, can be calculated as in Equation 1 below.

$$G_N = B_N F^{\otimes n},\ N = 2^n,\ F = \begin{bmatrix} 1 & 0 \\ 1 & 1 \end{bmatrix}, \quad \text{[Equation 1]}$$

$$F^{\otimes n} = F \otimes F^{\otimes(n-1)},\ F^{\otimes 0} = 1,\ B_N = R_N\left(I_2 \otimes B_{\frac{N}{2}}\right)$$

In Equation 1, R_N represents a bit-reversal interleaver, and maps the input $$s_1^N$$

to become the output $$x_i^N = (s_1, s_3, \ldots, s_{N-1}, s_2, \ldots, s_N).$$

Figure 11:
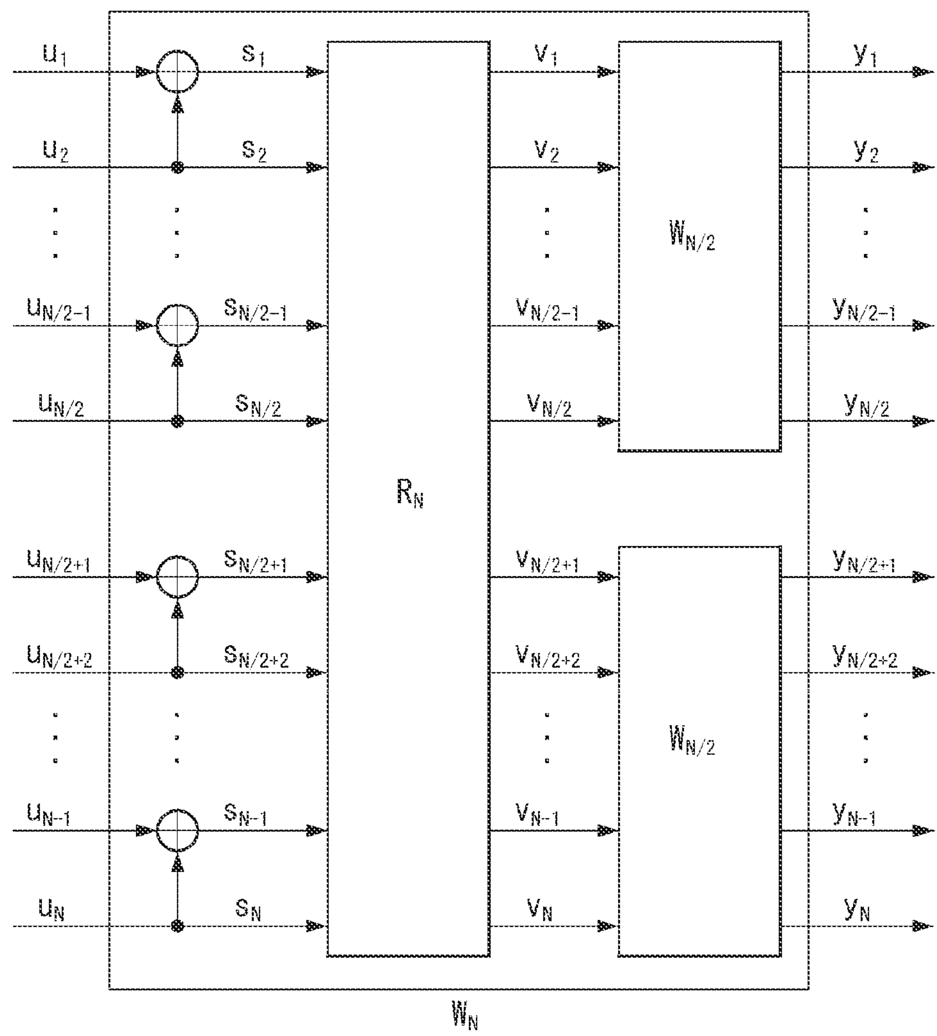
FIG. 11 is a diagram illustrating N-th level channel combining for polar coding according to an embodiment of the present disclosure.

This relationship is shown in FIG. 11.

FIG. 11 is a diagram illustrating N-th level channel combining for polar coding according to an embodiment of the present disclosure. Referring to FIG. 11, N, which is the size of a code block, may be limited to have a value of $2^N$ (where n is a natural number).

The process of combining N binary-input discrete memoryless channels (B-DMC) and then defining an equivalent channel for a specific input is called channel splitting. This can be expressed as channel transition probability as shown in Equation 2 below.

$$W_N^{(i)}\left(y_1^N, u_1^{i-1} \mid u_i\right) = \sum_{u_{i+1}^N} \frac{1}{2^{N-1}} W_N\left(y_1^N \mid u_1^N\right) \quad \text{[Equation 2]}$$

When channel combining and channel splitting are performed, the following theorem can be defined.

For any binary-input discrete memoryless channel (B-DMC) W, the corresponding channels $$\left\{W_N^{(i)}\right\}$$

are polarized in the following perspectives. Specifically, $$\left\{W_N^{(i)}\right\}$$

is polarized for a fixed $\delta \in (0, 1)$ based on the following i) and ii).

i) N becomes infinity through the square of 2 ii) The fraction of indices $i \in \{1, \ldots, N\}$ for which $$I(W_N^{(i)}) \in (1-\delta, 1]$$

becomes I(W), and the fraction for which $$I(W_N^{(i)}) \in [0, \delta)$$

becomes 1−I(W)

Therefore, as N goes to infinity, the channels are polarized to be either completely noisy or noisy free. Since the transmitter side accurately knows the polarized channels, bad channels can be corrected and uncoded bits can be transmitted through good channels.

That is, when the size N of the code block becomes infinite, the equivalent channel for a specific input bit may be classified as a noisy channel or a noise-free channel. This means that the capacity of the equivalent channel for a specific input bit is classified as 0 or I(W) (capacity of channel W).

The decoding method for this polar code is successive cancellation decoding (SC decoding) method. The successive cancellation decoding (SC decoding) method is a method of obtaining the channel transition probability and calculating the likelihood ratio (LLR) for the input bit. At this time, the channel transition probability can be calculated in a recursive form using the characteristic that the channel combining process and the channel splitting process are performed in a recursive form.

Therefore, the final likelihood ratio (LLR) value can also be calculated in a recursive form. First, $$W_N^{(i)}(y_1^N, u_1^{i-1} \mid u_i),$$

which is the channel transition probability for the input bit ui, can be calculated based on Equation 3 and Equation 4 below.

$$u_1^i$$

is divided into odd index and even index, and each can be expressed as $$u_{1,o}^I, u_{1,e}^i.$$

[Equation 3]

$$W_{2N}^{(2i-1)}(y_1^{2N}, u_1^{2i-2}|u_{2i-1}) = \sum_{u_{2i}^{2N}} \frac{1}{2^{2N-1}} W_{2N}(y_1^{2N}|u_1^{2N}) =$$

$$\sum_{u_{2i,o}^{2N}, u_{2i,e}^{2N}} \frac{1}{2^{2N-1}} W_N(y_1^N|u_{1,o}^{2N} \oplus u_{1,e}^{2N}) W_N(y_{N+1}^{2N}|u_{1,e}^{2N}) =$$

$$\sum\nolimits_{u_{2i}} \frac{1}{2} \sum\nolimits_{u_{2i+1,e}^{2N}} \frac{1}{2^{N-1}}$$

-continued $$W_N(y_{N+1}^{2N}|u_{1,e}^{2N}) \cdot \sum\nolimits_{u_{2i+1,o}^{2N}} \frac{1}{2^{N-1}} W_N(y_1^N|u_{1,o}^{2N} \oplus u_{1,e}^{2N}) =$$

$$\sum\nolimits_{u_{2i}} \frac{1}{2} W_N^{(i)}(y_1^N, u_{1,o}^{2i-2} \oplus u_{1,e}^{2i-2}|u_{2i-1} \oplus u_{2i}) \cdot W_N^{(i)}(y_{N+1}^{2N}, u_{1,e}^{2i-2}|u_{2i})$$

using the definition of $$W_N^{(i)}(y_1^N, u_1^{i-1}|u_i) = \sum\nolimits_{u_{i+1}^N} \frac{1}{2^{N-1}} W_N(y_N^N|u_1^N)$$

[Equation 4]

$$W_{2N}^{(2i-1)}(y_1^{2N}, u_1^{2i-2}|u_{2i-1}) = \sum\nolimits_{u_{2i+1}^{2N}} \frac{1}{2^{2N-1}} W_{2N}(y_1^{2N}|u_1^{2N}) =$$

$$\sum\nolimits_{u_{2i+1,o}^{2N}, u_{2i+1,e}^{2N}} \frac{1}{2^{2N-1}} W_N(y_1^N|u_{1,o}^{2N} \oplus u_{1,e}^{2N}) W_N(y_{N+1}^{2N}|u_{1,e}^{2N}) =$$

$$\frac{1}{2} \sum\nolimits_{u_{2i+1,e}^{2N}} \frac{1}{2^{N-1}}$$

$$W_N(y_{N+1}^{2N}|u_{1,e}^{2N}) \cdot \sum\nolimits_{u_{2i+1,o}^{2N}} \frac{1}{2^{N-1}} W_N(y_1^N|u_{1,o}^{2N} \oplus u_{1,e}^{2N}) =$$

$$\frac{1}{2} W_N^{(i)}(y_1^N, u_{1,o}^{2i-2} \oplus u_{1,e}^{2i-2}|u_{2i-1} \oplus u_{2i}) \cdot W_N^{(i)}(y_{N+1}^{2N}, u_{1,e}^{2i-2}|u_{2i})$$

At this time, $$L_N^{(i)} = \frac{w_N^{(i)}(y_1^N, \hat{u}_1^{i-1}|0)}{w_N^{(i)}(y_1^N, \hat{u}_1^{i-1}|1)},$$

which is LLR, can be calculated based on the following Equation 5 and Equation 6.

[Equation 5]

$$L_N^{(2i-1)}(y_1^N, \hat{u}_1^{2i-2}) = \frac{L_{N/2}^{(i)}(y_1^{N/2}, \hat{u}_{1,o}^{2i-2} \oplus \hat{u}_{1,e}^{2i-2}) L_{N/2}^{(i)}\left(y_{\frac{N}{2}+1}^N, \hat{u}_{1,e}^{2i-2}\right) + 1}{L_{N/2}^{(i)}(y_1^{N/2}, \hat{u}_{1,o}^{2i-2} \oplus \hat{u}_{1,e}^{2i-2}) + L_{N/2}^{(i)}\left(y_{\frac{N}{2}+1}^N, \hat{u}_{1,e}^{2i-2}\right)}$$

[Equation 6]

$$L_N^{(2i)}(y_1^N, \hat{u}_1^{2i-2}) = \left[L_{N/2}^{(i)}(y_1^{N/2}, \hat{u}_{1,o}^{2i-2} \oplus \hat{u}_{1,e}^{2i-2})\right]^{1-2\hat{u}_{2i-1}} \cdot L_{N/2}^{(i)}\left(y_{\frac{N}{2}+1}^N, \hat{u}_{1,e}^{2i-2}\right)$$

The complexity of a polar encoder and SC decoder depends on the code block length N. As an example, the complexity can be expressed as O(N log N).

Assuming K bits of input bits in a polar code of length N, the coding rate becomes K/N. At this time, when the generator matrix of the polar encoder with data payload size N is $G_N$, the following can be assumed.

The encoded bit can be expressed as $$x_1^N = u_1^N G_N.$$

K bits among $$u_1^N$$

correspond to payload bits. The row index of $G_N$ corresponding to the payload bit is assumed to be I, and the row index of $G_N$ corresponding to the remaining N−K bits is assumed to be F.

The minimum distance of the above polar code can be defined as in Equation 7 below.

$$d_{min}(C) = \min_{i \in I} 2^{wt(i)} \quad \text{[Equation 7]}$$

In Equation 7 above, wt(i) means the number of ones in the binary expansion of i, i=0, 1, . . . , N−1.

As described previously, through the process of channel combining and channel splitting, equivalent channels are divided into noisy channels and noise free channels, and the data payload must be transmitted on noise free channels.

That is, in terms of communication performance, the data payload must be transmitted on a noise-free equivalent channel. At this time, a method of finding a noise-free equivalent channel can be determined by obtaining $Z(W)=\Sigma\sqrt{W(y|0)W(y|1)}$ value of the equivalent channel for each input bit. The Z(W) is a Battacharyya parameter. The Battacharyya parameter is a value corresponding to the upper-bound of the error probability related to Maximum A Posteriori decision (MAP decision) when a binary input of 0 or 1 is transmitted. Maximum a posteriori (MAP) refers to the mode of posterior probability in Bayesian statistics.

Accordingly, once the Z(W) value is calculated, the channel(s) for transmitting the data payload can be selected by arranging the values in ascending order (smallest to largest). In the embodiments described later in the present disclosure, a reliability value of a bit channel index of the polar encoder can be expressed as Z(W).

Z(W) can be calculated based on Equation 8 below for a binary erasure channel (BEC).

[Equation 8]

$$Z(W_N^{(i)}) = Z(W_{(b_1 b_2, \dots, b_{k-1})}) = \begin{cases} 2Z(W_{(b_1 b_2, \dots, b_{k-1})}) - Z(W_{(b_1 b_2, \dots, b_{k-1})})^2, & \text{if } b_k = 0 \\ Z(W_{(b_1 b_2, \dots, b_{k-1})})^2, & \text{if } 1_k) = i \end{cases}$$

Using Equation 8 above, the Z(W) value that the erasure probability of the binary erasure channel (BEC) is 0.5 and the size of the code block is 8 is calculated as follows.

$$Z(W)=\{1.00,0.68,0.81,0.12,0.88,0.19,0.32,0.00\}$$

Therefore, when the size of the data payload is 2, the data payload can be transmitted on the 8th equivalent channel (Z(W)=0.00) and the 4th equivalent channel (Z(W)=0.12).

Polar Code in NR Standard

First, information bit allocation is examined in detail.

As described above, a reliability is different depending on the position of the input of the polar encoder. As an example, the reliability may mean the Z(W) value.

Polar encoding may be performed as follows.

The corresponding data blocks are allocated to a bit channel in order of the reliability depending on the size of the data block, and all others are configured as frozen (e.g. value of ‘0’).

In more detail, assuming that the mother code size of the polar encoder is N, and a data block size is K, the polar encoding can be performed as follows. Data blocks are arranged in K bit channels in order of the reliability, and N−K bit channels are configured as 0.

In the present disclosure, the arrangement of the data block/data bit on the bit channel may be expressed as the allocation of a bit channel on the data block/data bit. The data bit (u3) in 18*c* of FIG. 18 described later will be described as a specific example. The above example can be expressed as 1) or 2) below.

1) data bit (e.g. u3) is arranged at bit channel index 31 and bit channel index 60
2) bit channel index 31 and bit channel index 60 are allocated to data bit (e.g. u3)

Table 5 below illustrates the bit channel index according to the reliability order when the maximum mother code size is 1024. If the mother code size is less than 1024, a bit channel index can be configured according to the reliability by using the nested method, which removes bit channel indices greater than the corresponding mother code size.

Here, the polar sequence is $$Q_0^{N_{max}-1} = \{Q_0^{N_{max}}, Q_1^{N_{max}}, \dots Q_{N_{max}-1}^{N_{max}}\}, 0 \le Q_i^{N_{max}} \le N_{max} - 1$$

represents the bit channel index of the polar encoder, and i=0, 1, . . . , $N_{max}$ and $N_{max}$=1024.

$$W(Q_i^{N_{max}}),$$

which indicates the reliability of the bit channel index, satisfies $$W(Q_0^{N_{max}}) < W(Q_1^{N_{max}}) < \dots < W(Q_{N_{max}-1}^{N_{max}}).$$

TABLE 5

| $W(Q_i^{N_{max}})$ | $Q_i^{N_{max}}$ |
|---|---|
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 64 |
| 10 | 9 |
| 11 | 6 |
| 12 | 17 |
| 13 | 10 |
| 14 | 18 |
| 15 | 128 |
| 16 | 12 |
| 17 | 33 |
| 18 | 65 |

TABLE 5-continued

| $W(Q_i^{N_{max}})$ | $Q_i^{N_{max}}$ |
|---|---|
| 19 | 20 |
| 20 | 256 |
| 21 | 34 |
| 22 | 24 |
| 23 | 36 |
| 24 | 7 |
| 25 | 129 |
| 26 | 66 |
| 27 | 512 |
| 28 | 11 |
| 29 | 40 |
| 30 | 68 |
| 31 | 130 |
| 32 | 19 |
| 33 | 13 |
| 34 | 48 |
| 35 | 14 |
| 36 | 72 |
| 37 | 257 |
| 38 | 21 |
| 39 | 132 |
| 40 | 35 |
| 41 | 258 |
| 42 | 26 |
| 43 | 513 |
| 44 | 80 |
| 45 | 37 |
| 46 | 25 |
| 47 | 22 |
| 48 | 136 |
| 49 | 260 |
| 50 | 264 |
| 51 | 38 |
| 52 | 514 |
| 53 | 96 |
| 54 | 67 |
| 55 | 41 |
| 56 | 144 |
| 57 | 28 |
| 58 | 69 |
| 59 | 42 |
| 60 | 516 |
| 61 | 49 |
| 62 | 74 |
| 63 | 272 |
| 64 | 160 |
| 65 | 520 |
| 66 | 288 |
| 67 | 528 |
| 68 | 192 |
| 69 | 544 |
| 70 | 70 |
| 71 | 44 |
| 72 | 131 |
| 73 | 81 |
| 74 | 50 |
| 75 | 73 |
| 76 | 15 |
| 77 | 320 |
| 78 | 133 |
| 79 | 52 |
| 80 | 23 |
| 81 | 134 |
| 82 | 384 |
| 83 | 76 |
| 84 | 137 |
| 85 | 82 |
| 86 | 56 |
| 87 | 27 |
| 88 | 97 |
| 89 | 39 |
| 90 | 259 |
| 91 | 84 |

TABLE 5-continued

| $W(Q_i^{N_{max}})$ | $Q_i^{N_{max}}$ |
|---|---|
| 92 | 138 |
| 93 | 145 |
| 94 | 261 |
| 95 | 29 |
| 96 | 43 |
| 97 | 98 |
| 98 | 515 |
| 99 | 88 |
| 100 | 140 |
| 101 | 30 |
| 102 | 146 |
| 103 | 71 |
| 104 | 262 |
| 105 | 265 |
| 106 | 161 |
| 107 | 576 |
| 108 | 45 |
| 109 | 100 |
| 110 | 640 |
| 111 | 51 |
| 112 | 148 |
| 113 | 46 |
| 114 | 75 |
| 115 | 266 |
| 116 | 273 |
| 117 | 517 |
| 118 | 104 |
| 119 | 162 |
| 120 | 53 |
| 121 | 193 |
| 122 | 152 |
| 123 | 77 |
| 124 | 164 |
| 125 | 768 |
| 126 | 268 |
| 127 | 274 |
| 128 | 518 |
| 129 | 54 |
| 130 | 83 |
| 131 | 57 |
| 132 | 521 |
| 133 | 112 |
| 134 | 135 |
| 135 | 78 |
| 136 | 289 |
| 137 | 194 |
| 138 | 85 |
| 139 | 276 |
| 140 | 522 |
| 141 | 58 |
| 142 | 168 |
| 143 | 139 |
| 144 | 99 |
| 145 | 86 |
| 146 | 60 |
| 147 | 280 |
| 148 | 89 |
| 149 | 290 |
| 150 | 529 |
| 151 | 524 |
| 152 | 196 |
| 153 | 141 |
| 154 | 101 |
| 155 | 147 |
| 156 | 176 |
| 157 | 142 |
| 158 | 530 |
| 159 | 321 |
| 160 | 31 |
| 161 | 200 |
| 162 | 90 |
| 163 | 545 |
| 164 | 292 |

TABLE 5-continued

| $W(Q_i^{N_{max}})$ | $Q_i^{N_{max}}$ |
|---|---|
| 165 | 322 |
| 166 | 532 |
| 167 | 263 |
| 168 | 149 |
| 169 | 102 |
| 170 | 105 |
| 171 | 304 |
| 172 | 296 |
| 173 | 163 |
| 174 | 92 |
| 175 | 47 |
| 176 | 267 |
| 177 | 385 |
| 178 | 546 |
| 179 | 324 |
| 180 | 208 |
| 181 | 386 |
| 182 | 150 |
| 183 | 153 |
| 184 | 165 |
| 185 | 106 |
| 186 | 55 |
| 187 | 328 |
| 188 | 536 |
| 189 | 577 |
| 190 | 548 |
| 191 | 113 |
| 192 | 154 |
| 193 | 79 |
| 194 | 269 |
| 195 | 108 |
| 196 | 578 |
| 197 | 224 |
| 198 | 166 |
| 199 | 519 |
| 200 | 552 |
| 201 | 195 |
| 202 | 270 |
| 203 | 641 |
| 204 | 523 |
| 205 | 275 |
| 206 | 580 |
| 207 | 291 |
| 208 | 59 |
| 209 | 169 |
| 210 | 560 |
| 211 | 114 |
| 212 | 277 |
| 213 | 156 |
| 214 | 87 |
| 215 | 197 |
| 216 | 116 |
| 217 | 170 |
| 218 | 61 |
| 219 | 531 |
| 220 | 525 |
| 221 | 642 |
| 222 | 281 |
| 223 | 278 |
| 224 | 526 |
| 225 | 177 |
| 226 | 293 |
| 227 | 388 |
| 228 | 91 |
| 229 | 584 |
| 230 | 769 |
| 231 | 198 |
| 232 | 172 |
| 233 | 120 |
| 234 | 201 |
| 235 | 336 |
| 236 | 62 |
| 237 | 282 |
| 238 | 143 |
| 239 | 103 |
| 240 | 178 |
| 241 | 294 |

TABLE 5-continued

| $W(Q_i^{N_{max}})$ | $Q_i^{N_{max}}$ |
|---|---|
| 242 | 93 |
| 243 | 644 |
| 244 | 202 |
| 245 | 592 |
| 246 | 323 |
| 247 | 392 |
| 248 | 297 |
| 249 | 770 |
| 250 | 107 |
| 251 | 180 |
| 252 | 151 |
| 253 | 209 |
| 254 | 284 |
| 255 | 648 |
| 256 | 94 |
| 257 | 204 |
| 258 | 298 |
| 259 | 400 |
| 260 | 608 |
| 261 | 352 |
| 262 | 325 |
| 263 | 533 |
| 264 | 155 |
| 265 | 210 |
| 266 | 305 |
| 267 | 547 |
| 268 | 300 |
| 269 | 109 |
| 270 | 184 |
| 271 | 534 |
| 272 | 537 |
| 273 | 115 |
| 274 | 167 |
| 275 | 225 |
| 276 | 326 |
| 277 | 306 |
| 278 | 772 |
| 279 | 157 |
| 280 | 656 |
| 281 | 329 |
| 282 | 110 |
| 283 | 117 |
| 284 | 212 |
| 285 | 171 |
| 286 | 776 |
| 287 | 330 |
| 288 | 226 |
| 289 | 549 |
| 290 | 538 |
| 291 | 387 |
| 292 | 308 |
| 293 | 216 |
| 294 | 416 |
| 295 | 271 |
| 296. | 279 |
| 297 | 158 |
| 298 | 337 |
| 299 | 550 |
| 300 | 672 |
| 301 | 118 |
| 302 | 332 |
| 303 | 579 |
| 304 | 540 |
| 305 | 389 |
| 306 | 173 |
| 307 | 121 |
| 308 | 553 |
| 309 | 199 |
| 310 | 784 |
| 311 | 179 |
| 312 | 228 |
| 313 | 338 |
| 314 | 312 |
| 315 | 704 |
| 316 | 390 |
| 317 | 174 |
| 318 | 554 |

TABLE 5-continued

| $W(Q_i^{Nmax})$ | $Q_i^{Nmax}$ |
|---|---|
| 319 | 581 |
| 320 | 393 |
| 321 | 283 |
| 322 | 122 |
| 323 | 448 |
| 324 | 353 |
| 325 | 561 |
| 326 | 203 |
| 327 | 63 |
| 328 | 340 |
| 329 | 394 |
| 330 | 527 |
| 331 | 582 |
| 332 | 556 |
| 333 | 181 |
| 334 | 295 |
| 335 | 285 |
| 336 | 232 |
| 337 | 124 |
| 338 | 205 |
| 339 | 182 |
| 340 | 643 |
| 341 | 562 |
| 342 | 286 |
| 343 | 585 |
| 344 | 299 |
| 345 | 354 |
| 346 | 211 |
| 347 | 401 |
| 348 | 185 |
| 349 | 396 |
| 350 | 344 |
| 351 | 586 |
| 352 | 645 |
| 353 | 593 |
| 354 | 535 |
| 355 | 240 |
| 356 | 206 |
| 357 | 95 |
| 358 | 327 |
| 359 | 564 |
| 360 | 800 |
| 361 | 402 |
| 362 | 356 |
| 363 | 307 |
| 364 | 301 |
| 365 | 417 |
| 366 | 213 |
| 367 | 568 |
| 368 | 832 |
| 369 | 588 |
| 370 | 186 |
| 371 | 646 |
| 372 | 404 |
| 373 | 227 |
| 374 | 896 |
| 375 | 594 |
| 376 | 418 |
| 377 | 302 |
| 378 | 649 |
| 379 | 771 |
| 380 | 360 |
| 381 | 539 |
| 382 | 111 |
| 383 | 331 |
| 384 | 214 |
| 385 | 309 |
| 386 | 188 |
| 387 | 449 |
| 388 | 217 |
| 389 | 408 |
| 390 | 609 |
| 391 | 596 |
| 392 | 551 |
| 393 | 650 |
| 394 | 229 |
| 395 | 159 |

TABLE 5-continued

| $W(Q_i^{Nmax})$ | $Q_i^{Nmax}$ |
|---|---|
| 396 | 420 |
| 397 | 310 |
| 398 | 541 |
| 399 | 773 |
| 400 | 610 |
| 401 | 657 |
| 402 | 333 |
| 403 | 119 |
| 404 | 600 |
| 405 | 339 |
| 406 | 218 |
| 407 | 368 |
| 408 | 652 |
| 409 | 230 |
| 410 | 391 |
| 411 | 313 |
| 412 | 450 |
| 413 | 542 |
| 414 | 334 |
| 415 | 233 |
| 416 | 555 |
| 417 | 774 |
| 418 | 175 |
| 419 | 123 |
| 420 | 658 |
| 421 | 612 |
| 422 | 341 |
| 423 | 777 |
| 424 | 220 |
| 425 | 314 |
| 426 | 424 |
| 427 | 395 |
| 428 | 673 |
| 429 | 583 |
| 430 | 355 |
| 431 | 287 |
| 432 | 183 |
| 433 | 234 |
| 434 | 125 |
| 435 | 557 |
| 436 | 660 |
| 437 | 616 |
| 438 | 342 |
| 439 | 316 |
| 440 | 241 |
| 441 | 778 |
| 442 | 563 |
| 443 | 345 |
| 444 | 452 |
| 445 | 397 |
| 446 | 403 |
| 447 | 207 |
| 448 | 674 |
| 449 | 558 |
| 450 | 785 |
| 451 | 432 |
| 452 | 357 |
| 453 | 187 |
| 454 | 236 |
| 455 | 664 |
| 456 | 624 |
| 457 | 587 |
| 458 | 780 |
| 459 | 705 |
| 460 | 126 |
| 461 | 242 |
| 462 | 565 |
| 463 | 398 |
| 464 | 346 |
| 465 | 456 |
| 466 | 358 |
| 467 | 405 |
| 468 | 303 |
| 469 | 569 |
| 470 | 244 |
| 471 | 595 |
| 472 | 189 |

TABLE 5-continued

| $W(Q_i^{N_{max}})$ | $Q_i^{N_{max}}$ |
|---|---|
| 473 | 566 |
| 474 | 676 |
| 475 | 361 |
| 476 | 706 |
| 477 | 589 |
| 478 | 215 |
| 479 | 786 |
| 480 | 647 |
| 481 | 348 |
| 482 | 419 |
| 483 | 406 |
| 484 | 464 |
| 485 | 680 |
| 486 | 801 |
| 487 | 362 |
| 488 | 590 |
| 489 | 409 |
| 490 | 570 |
| 491 | 788 |
| 492 | 597 |
| 493 | 572 |
| 494 | 219 |
| 495 | 311 |
| 496 | 708 |
| 497 | 598 |
| 498 | 601 |
| 499 | 651 |
| 500 | 421 |
| 501 | 792 |
| 502 | 802 |
| 503 | 611 |
| 504 | 602 |
| 505 | 410 |
| 506 | 231 |
| 507 | 688 |
| 508 | 653 |
| 509 | 248 |
| 510 | 369 |
| 511 | 190 |
| 512 | 364 |
| 513 | 654 |
| 514 | 659 |
| 515 | 335 |
| 516 | 480 |
| 517 | 315 |
| 518 | 221 |
| 519 | 370 |
| 520 | 613 |
| 521 | 422 |
| 522 | 425 |
| 523 | 451 |
| 524 | 614 |
| 525 | 543 |
| 526 | 235 |
| 527 | 412 |
| 528 | 343 |
| 529 | 372 |
| 530 | 775 |
| 531 | 317 |
| 532 | 222 |
| 533 | 426 |
| 534 | 453 |
| 535 | 237 |
| 536 | 559 |
| 537 | 833 |
| 538 | 804 |
| 539 | 712 |
| 540 | 834 |
| 541 | 661 |
| 542 | 808 |
| 543 | 779 |
| 544 | 617 |
| 545 | 604 |
| 546 | 433 |
| 547 | 720 |
| 548 | 816 |
| 549 | 836 |

TABLE 5-continued

| $W(Q_i^{N_{max}})$ | $Q_i^{N_{max}}$ |
|---|---|
| 550 | 347 |
| 551 | 897 |
| 552 | 243 |
| 553 | 662 |
| 554 | 454 |
| 555 | 318 |
| 556 | 675 |
| 557 | 618 |
| 558 | 898 |
| 559 | 781 |
| 560 | 376 |
| 561 | 428 |
| 562 | 665 |
| 563 | 736 |
| 564 | 567 |
| 565 | 840 |
| 566 | 625 |
| 567 | 238 |
| 568 | 359 |
| 569 | 457 |
| 570 | 399 |
| 571 | 787 |
| 572 | 591 |
| 573 | 678 |
| 574 | 434 |
| 575 | 677 |
| 576 | 349 |
| 577 | 245 |
| 578 | 458 |
| 579 | 666 |
| 580 | 620 |
| 581 | 363 |
| 582 | 127 |
| 583 | 191 |
| 584 | 782 |
| 585 | 407 |
| 586 | 436 |
| 587 | 626 |
| 588 | 571 |
| 589 | 465 |
| 590 | 681 |
| 591 | 246 |
| 592 | 707 |
| 593 | 350 |
| 594 | 599 |
| 595 | 668 |
| 596 | 790 |
| 597 | 460 |
| 598 | 249 |
| 599 | 682 |
| 600 | 573 |
| 601 | 411 |
| 602 | 803 |
| 603 | 789 |
| 604 | 709 |
| 605 | 365 |
| 606 | 440 |
| 607 | 628 |
| 608 | 689 |
| 609 | 374 |
| 610 | 423 |
| 611 | 466 |
| 612 | 793 |
| 613 | 250 |
| 614 | 371 |
| 615 | 481 |
| 616 | 574 |
| 617 | 413 |
| 618 | 603 |
| 619 | 366 |
| 620 | 468 |
| 621 | 655 |
| 622 | 900 |
| 623 | 805 |
| 624 | 615 |
| 625 | 684 |
| 626 | 710 |

TABLE 5-continued

| $W(Q_i^{N_{max}})$ | $Q_i^{N_{max}}$ |
|---|---|
| 627 | 429 |
| 628 | 794 |
| 629 | 252 |
| 630 | 373 |
| 631 | 605 |
| 632 | 848 |
| 633 | 690 |
| 634 | 713 |
| 635 | 632 |
| 636 | 482 |
| 637 | 806 |
| 638 | 427 |
| 639 | 904 |
| 640 | 414 |
| 641 | 223 |
| 642 | 663 |
| 643 | 692 |
| 644 | 835 |
| 645 | 619 |
| 646 | 472 |
| 647 | 455 |
| 648 | 796 |
| 649 | 809 |
| 650 | 714 |
| 651 | 721 |
| 652 | 837 |
| 653 | 716 |
| 654 | 864 |
| 655 | 810 |
| 656 | 606 |
| 657 | 912 |
| 658 | 722 |
| 659 | 696 |
| 660 | 377 |
| 661 | 435 |
| 662 | 817 |
| 663 | 319 |
| 664 | 621 |
| 665 | 812 |
| 666 | 484 |
| 667 | 430 |
| 668 | 838 |
| 669 | 667 |
| 670 | 488 |
| 671 | 239 |
| 672 | 378 |
| 673 | 459 |
| 674 | 622 |
| 675 | 627 |
| 676 | 437 |
| 677 | 380 |
| 678 | 818 |
| 679 | 461 |
| 680 | 496 |
| 681 | 669 |
| 682 | 679 |
| 683 | 724 |
| 684 | 841 |
| 685 | 629 |
| 686 | 351 |
| 687 | 467 |
| 688 | 438 |
| 689 | 737 |
| 690 | 251 |
| 691 | 462 |
| 692 | 442 |
| 693 | 441 |
| 694 | 469 |
| 695 | 247 |
| 696 | 683 |
| 697 | 842 |
| 698 | 738 |
| 699 | 899 |
| 700 | 670 |
| 701 | 783 |
| 702 | 849 |
| 703 | 820 |
| 704 | 728 |
| 705 | 928 |
| 706 | 791 |
| 707 | 367 |
| 708 | 901 |
| 709 | 630 |
| 710 | 685 |
| 711 | 844 |
| 712 | 633 |
| 713 | 711 |
| 714 | 253 |
| 715 | 691 |
| 716 | 824 |
| 717 | 902 |
| 718 | 686 |
| 719 | 740 |
| 720 | 850 |
| 721 | 375 |
| 722 | 444 |
| 723 | 470 |
| 724 | 483 |
| 725 | 415 |
| 726 | 485 |
| 727 | 905 |
| 728 | 795 |
| 729 | 473 |
| 730 | 634 |
| 731 | 744 |
| 732 | 852 |
| 733 | 960 |
| 734 | 865 |
| 735 | 693 |
| 736 | 797 |
| 737 | 906 |
| 738 | 715 |
| 739 | 807 |
| 740 | 474 |
| 741 | 636 |
| 742 | 694 |
| 743 | 254 |
| 744 | 717 |
| 745 | 575 |
| 746 | 913 |
| 747 | 798 |
| 748 | 811 |
| 749 | 379 |
| 750 | 697 |
| 751 | 431 |
| 752 | 607 |
| 753 | 489 |
| 754 | 866 |
| 755 | 723 |
| 756 | 486 |
| 757 | 908 |
| 758 | 718 |
| 759 | 813 |
| 760 | 476 |
| 761 | 856 |
| 762 | 839 |
| 763 | 725 |
| 764 | 698 |
| 765 | 914 |
| 766 | 752 |
| 767 | 868 |
| 768 | 819 |
| 769 | 814 |
| 770 | 439 |

TABLE 5-continued

| $W(Q_i^{N_{max}})$ | $Q_i^{N_{max}}$ |
|---|---|
| 771 | 929 |
| 772 | 490 |
| 773 | 623 |
| 774 | 671 |
| 775 | 739 |
| 776 | 916 |
| 777 | 463 |
| 778 | 843 |
| 779 | 381 |
| 780 | 497 |
| 781 | 930 |
| 782 | 821 |
| 783 | 726 |
| 784 | 961 |
| 785 | 872 |
| 786 | 492 |
| 787 | 631 |
| 788 | 729 |
| 789 | 700 |
| 790 | 443 |
| 791 | 741 |
| 792 | 845 |
| 793 | 920 |
| 794 | 382 |
| 795 | 822 |
| 796 | 851 |
| 797 | 730 |
| 798 | 498 |
| 799 | 880 |
| 800 | 742 |
| 801 | 445 |
| 802 | 471 |
| 803 | 635 |
| 804 | 932 |
| 805 | 687 |
| 806 | 903 |
| 807 | 825 |
| 808 | 500 |
| 809 | 846 |
| 810 | 745 |
| 811 | 826 |
| 812 | 732 |
| 813 | 446 |
| 814 | 962 |
| 815 | 936 |
| 816 | 475 |
| 817 | 853 |
| 818 | 867 |
| 819 | 637 |
| 820 | 907 |
| 821 | 487 |
| 822 | 695 |
| 823 | 746 |
| 824 | 828 |
| 825 | 753 |
| 826 | 854 |
| 827 | 857 |
| 828 | 504 |
| 829 | 799 |
| 830 | 255 |
| 831 | 964 |
| 832 | 909 |
| 833 | 719 |
| 834 | 477 |
| 835 | 915 |
| 836 | 638 |
| 837 | 748 |
| 838 | 944 |
| 839 | 869 |
| 840 | 491 |
| 841 | 699 |
| 842 | 754 |

TABLE 5-continued

| $W(Q_i^{N_{max}})$ | $Q_i^{N_{max}}$ |
|---|---|
| 843 | 858 |
| 844 | 478 |
| 845 | 968 |
| 846 | 383 |
| 847 | 910 |
| 848 | 815 |
| 849 | 976 |
| 850 | 870 |
| 851 | 917 |
| 852 | 727 |
| 853 | 493 |
| 854 | 873 |
| 855 | 701 |
| 856 | 931 |
| 857 | 756 |
| 858 | 860 |
| 859 | 499 |
| 860 | 731 |
| 861 | 823 |
| 862 | 922 |
| 863 | 874 |
| 864 | 918 |
| 865 | 502 |
| 866 | 933 |
| 867 | 743 |
| 868 | 760 |
| 869 | 881 |
| 870 | 494 |
| 871 | 702 |
| 872 | 921 |
| 873 | 501 |
| 874 | 876 |
| 875 | 847 |
| 876 | 992 |
| 877 | 447 |
| 878 | 733 |
| 879 | 827 |
| 880 | 934 |
| 881 | 882 |
| 882 | 937 |
| 883 | 963 |
| 884 | 747 |
| 885 | 505 |
| 886 | 855 |
| 887 | 924 |
| 888 | 734 |
| 889 | 829 |
| 890 | 965 |
| 891 | 938 |
| 892 | 884 |
| 893 | 506 |
| 894 | 749 |
| 895 | 945 |
| 896 | 966 |
| 897 | 755 |
| 898 | 859 |
| 899 | 940 |
| 900 | 830 |
| 901 | 911 |
| 902 | 871 |
| 903 | 639 |
| 904 | 888 |
| 905 | 479 |
| 906 | 946 |
| 907 | 750 |
| 908 | 969 |
| 909 | 508 |
| 910 | 861 |
| 911 | 757 |
| 912 | 970 |
| 913 | 919 |
| 914 | 875 |

TABLE 5-continued

| $W(Q_i^{N_{max}})$ | $Q_i^{N_{max}}$ |
|---|---|
| 915 | 862 |
| 916 | 758 |
| 917 | 948 |
| 918 | 977 |
| 919 | 923 |
| 920 | 972 |
| 921 | 761 |
| 922 | 877 |
| 923 | 952 |
| 924 | 495 |
| 925 | 703 |
| 926 | 935 |
| 927 | 978 |
| 928 | 883 |
| 929 | 762 |
| 930 | 503 |
| 931 | 925 |
| 932 | 878 |
| 933 | 735 |
| 934 | 993 |
| 935 | 885 |
| 936 | 939 |
| 937 | 994 |
| 938 | 980 |
| 939 | 926 |
| 940 | 764 |
| 941 | 941 |
| 942 | 967 |
| 943 | 886 |
| 944 | 831 |
| 945 | 947 |
| 946 | 507 |
| 947 | 889 |
| 948 | 984 |
| 949 | 751 |
| 950 | 942 |
| 951 | 996 |
| 952 | 971 |
| 953 | 890 |
| 954 | 509 |
| 955 | 949 |
| 956 | 973 |
| 957 | 1000 |
| 958 | 892 |
| 959 | 950 |
| 960 | 863 |
| 961 | 759 |
| 962 | 1008 |
| 963 | 510 |
| 964 | 979 |
| 965 | 953 |
| 966 | 763 |
| 967 | 974 |
| 968 | 954 |
| 969 | 879 |
| 970 | 981 |
| 971 | 982 |
| 972 | 927 |
| 973 | 995 |
| 974 | 765 |
| 975 | 956 |
| 976 | 887 |
| 977 | 985 |
| 978 | 997 |
| 979 | 986 |
| 980 | 943 |
| 981 | 891 |
| 982 | 998 |
| 983 | 766 |
| 984 | 511 |
| 985 | 988 |
| 986 | 1001 |
| 987 | 951 |
| 988 | 1002 |
| 989 | 893 |
| 990. | 975 |
| 991 | 894 |
| 992 | 1009 |
| 993 | 955 |
| 994 | 1004 |
| 995 | 1010 |
| 996 | 957 |
| 997 | 983 |
| 998 | 958 |
| 999 | 987 |
| 1000 | 1012 |
| 1001 | 999 |
| 1002 | 1016 |
| 1003 | 767 |
| 1004 | 989 |
| 1005 | 1003 |
| 1006 | 990 |
| 1007 | 1005 |
| 1008 | 959 |
| 1009 | 1011 |
| 1010 | 1013 |
| 1011 | 895 |
| 1012 | 1006 |
| 1013 | 1014 |
| 1014 | 1017 |
| 1015 | 1018 |
| 1016 | 991 |
| 1017 | 1020 |
| 1018 | 1007 |
| 1019 | 1015 |
| 1020 | 1019 |
| 1021 | 1021 |
| 1022 | 1022 |
| 1023 | 1023 |

Rate Matching

In the NR standard, rate matching consists of interleaving and puncturing/shortening/repetition operations. If $d_0$, $d_1$, $d_2$, . . . , $d_{N-1}$ is the interleaver input and $y_0$, $y_1$, $y_2$, . . . , $y_{N-1}$ is the interleaver output, the input and output relationship of the interleaver is as follows.

```
for n = 0 to N −1
i = ⌊32n / N⌋;
J(n) = P(i)× (N / 32)+ mod( n, N / 32 ) ;
y_n = d_J(n) ;
end for
```

At this time, the interleaver pattern P(i) can be exemplified as shown in Table 6 below.

TABLE 6

| i | P(i) | i | P(i) | i | P(i) | i | P(i) | i | P(i) | i | P(i) | i | P(i) | i | P(i) |
|---|---|---|---|---|---|---|---|---|---|---|---|---|---|---|---|
| 0 | 0 | 4 | 3 | 8 | 8 | 12 | 10 | 16 | 12 | 20 | 14 | 24 | 24 | 28 | 27 |
| 1 | 1 | 5 | 5 | 9 | 16 | 13 | 18 | 17 | 20 | 21 | 22 | 25 | 25 | 29 | 29 |
| 2 | 2 | 6 | 6 | 10 | 9 | 14 | 11 | 18 | 13 | 22 | 15 | 26 | 26 | 30 | 30 |
| 3 | 4 | 7 | 7 | 11 | 17 | 15 | 19 | 19 | 21 | 23 | 23 | 27 | 28 | 31 | 31 |

The puncturing/shortening is a method of not transmitting part of the encoded bit when the resources allocated for transmission are less than the encoded bit. The repetition is a method of repeatedly transmitting part of the encoded bit when the resources allocated for transmission are greater than the encoded bit.

According to the NR standard, the puncturing and shortening are performed separately according to the coding rate. Specifically, when the size of the encoded bit is E and the data block size is K, If K/E≤7/16, the puncturing is performed, 2) If not (K/E is less than 7/16), the shortening is performed. Additionally, when the puncturing/shortening is performed, a specific bit channel of the encoder is configured as frozen (i.e. bit value 0) by a method exemplified in Table 7 below.

TABLE 7 if E < N
if K/E ≤ 7/16 -- puncturing
for n = 0 to N − E − 1

$$\tilde{Q}_{F,tmp}^{N} = \tilde{Q}_{F,tmp}^{N} \cup \{J(n)\};$$

end for
if E ≥ 3N/4

$$\overline{Q}_{F,tmp}^{N} = \overline{Q}_{F,tmp}^{N} \cup \{0, 1, \ldots, \lceil 3N/4 - E/2 \rceil - 1\};$$

else $$\overline{Q}_{F,tmp}^{N} = \overline{Q}_{F,tmp}^{N} \cup \{0, 1, \ldots, \lceil 3N/4 - E/2 \rceil - 1\};$$

else -- shortening
for n = E to N − 1

$$\overline{Q}_{F,tmp}^{N} = \overline{Q}_{F,tmp}^{N} \cup \{J(n)\}\};$$

end for
end if
end if $$\overline{Q}_{I,tmp}^{N} = Q_{0}^{N-1} \backslash \overline{Q}_{F,tmp}^{N};$$

$\overline{Q}_{I}^{N}$ comprises $(K+n_{PC})$ most reliable bit indices in $\overline{Q}_{I,tmp}^{N}$;

$$\overline{Q}_{F}^{N} = Q_{0}^{N-1} \backslash \overline{Q}_{I}^{N};$$

In Table 7, N is the mother code size, and $n_{PC}$ represents the number of parity check bits (PC bits) when a parity check polar code (PC polar code) is supported.

$$\overline{Q}_{I}^{N}$$

represents a bit channel index used for data block allocation in a polar sequence, and $$\overline{Q}_{F}^{N}$$

represents a bit channel index configured as frozen.

Parity Check Polar Code (PC Polar Code)

The PC polar code is a polar code that arranges a parity check bit (PC bit) generated using part of the data block at the input of the polar encoder. The PC polar code is a polar code supported when the data block size is 18<=K<=25.

In the NR standard, the PC bit is 3 bits, and is generated using a 5-bit shift register as shown in FIG. 12.

FIG. 12 is a diagram for explaining generation of a parity check bit according to an embodiment of the present disclosure.

Referring to FIG. 12, y[0], . . . , y[4], which is a 5-bit shift register in FIG. 12, is all initialized to 0. That is, the PC bit may be generated according to Table 8 below for the data block [u0, u1, u2, . . . , uN−1].

TABLE 8

| | |
|---|---|
| cyclic left shift the register | |
| if ui is an information bit: | set y [0] = (ui XOR y[0]) |
| if ui is a PC bit: | set ui =y [0] |

The PC bit generated in this way is allocated to the input bit channel of the polar encoder as follows. Here, when E−K+3>192, it is $$n_{PC}^{wm} = 1,$$

and when E−K+3<=192, it is $$n_{PC}^{wm} = 0.$$

And, $$\tilde{Q}_{I}^{N}$$

are the $$(|\tilde{Q}_{I}^{N}| - n_{PC})$$

most reliable bit indices in $$\tilde{Q}_{I}^{N}.$$

$$(n_{PC} - n_{PC}^{wm})$$

parity check bits are arranged in the $$(n_{PC} - n_{PC}^{wm})$$

least reliable bit indices in $$\tilde{Q}_{I}^{N}.$$

The remaining $$n_{PC}^{wm}$$

parity check bits are arranged in the bit indices of minimum row weight in $$\tilde{Q}_I^N.$$

If there are more bit indices with the same minimum row weight in $$\tilde{Q}_I^N$$

than $$n_{PC}^{wm},$$

the remaining $$n_{PC}^{wm}$$

parity check bits are arranged in $$n_{PC}^{wm}$$

bit indices with a highest reliability and minimum row weight in $$\tilde{Q}_I^N.$$

HARQ (Hybrid Automatic Repeat and reQuest)

HARQ is a technology that combines forward error correction (FEC) and automatic repeat request (ARQ). That is, the transmitter transmits all or part of the coded bits encoded using FEC, and the receiver detects errors in the received data and then transmits a HARQ-ACK signal to the transmitter. If there are no errors in the data received by the receiver, the transmitter transmits new data, while if there are errors in the received data, the transmitter retransmits the corresponding data block.

The receiver detects errors by combining the retransmitted data block with the previously transmitted data block and then decoding it again. This operation can be performed until no errors are detected or until a predetermined order is reached. Combining methods for decoding retransmitted data blocks can be divided into two types.

Chase combining: This is a method in which the same coded bit as the first transmitted coded bit is retransmitted. The error probability can be reduced through power gain when decoding a retransmitted data block.

Incremental redundancy: This is a method in which coded bits that are not the same as the first transmitted coded bit are retransmitted. When decoding a retransmitted data block, the error probability can be reduced through coding gain. In general, chase combining can be interpreted as a special embodiment of incremental redundancy.

In the present disclosure, a coded bit may mean a codeword.

HARQ methods can be divided as follows. HARQ methods can be divided into 1) synchronous HARQ and asynchronous HARQ depending on the timing of retransmission, and can be divided into 2) channel-adaptive methods and channel-non-adaptive methods depending on whether channel states are reflected in the amount of resources used in retransmission.

The synchronous HARQ method is a method in which, if the initial transmission fails, subsequent retransmission is performed at a timing determined by the system. That is, assuming that the timing of retransmission is made every fourth time unit after the initial transmission failure, this has already been agreed upon between the base station and the UE. Therefore, there is no need to perform additional signaling to inform this timing. However, if the data transmitting side receives a NACK message, the frame is retransmitted every fourth time unit until the ACK message is received.

On the other hand, in the Asynchronous HARQ method, retransmission timing may be newly scheduled or determined through additional signaling. On the other hand, the asynchronous HARQ method can be determined through new scheduling or additional signaling of retransmission timing. The timing at which retransmission of a previously failed frame occurs may vary depending on various factors such as channel states.

The channel-non-adaptive HARQ method is a method in which frame modulation, the number of resource blocks used, AMC, etc. are used as determined at the time of initial transmission in retransmission. In contrast, the channel-adaptive HARQ method is a method in which frame modulation, the number of resource blocks used, AMC, etc. are varied depending on the channel states.

For example, the transmitting side transmits data using 6 resource blocks during initial transmission, and then retransmits using the same 6 resource blocks in retransmission, which is a channel-non-adaptive HARQ method. On the other hand, even if transmission is first performed using 6 resource blocks, later retransmission is performed using resource blocks larger or smaller than 6 depending on the channel state, which is a channel-adaptive HARQ method.

Each of the four HARQ combinations can be achieved by this classification, but the mainly used HARQ method includes an asynchronous and channel-adaptive HARQ method and a synchronous and channel-non-adaptive HARQ method.

The asynchronous channel-adaptive HARQ method can maximize retransmission efficiency by adaptively varying the retransmission timing and amount of resources used depending on the channel states, but has the disadvantage of increasing overhead, so it is not generally considered for uplink.

On the other hand, the synchronous and channel-non-adaptive HARQ method has the advantage of almost no overhead for retransmission because the timing and resource allocation for retransmission are promised within the system, but has the disadvantage that retransmission efficiency is very low when used in highly variable channel states.

Hereinafter, a method of supporting HARQ of polar code is examined.

Incremental Freezing (IF)

When performing polar encoding, data blocks are arranged in the bit channels of the encoder in order of the reliability, and then encoding is performed. Incremental freezing is a HARQ method that achieves performance gains by arranging data arranged in a bit channel with a relatively low reliability into a channel with a high reliability and then encoding it when retransmitting.

FIG. 13 illustrates a polar encoding operation performed to support IF-HARQ according to an embodiment of the present disclosure.

Referring to FIG. 13, it is assumed that N, the mother code size, is 16, and the size K of the data block is 12. 13*a* represents bit channel indices, and 13*b* represents bit channel indices rearranged according to a reliability order. At this time, the reliability order may be an ascending order (low reliability→high reliability), but is not limited to this and a different order (descending order) may be applied.

When a data block is first transmitted, 13*c* represents data blocks (u0 to u11) allocated to bit channel indices 13*a*. When retransmission related to the data block is performed, 13*d* represents data blocks (u0 to u2, u4 to u6) allocated to the bit channel indices 13*a*.

In a polar encoder with N=16, the polar sequence 13*b* listed in an ascending order of the reliability is assumed to be {0, 1, 2, 4, 8, 3, 5, 6, 9, 10, 12, 7, 11, 13, 14, 15}.

In the first transmission (1st Tx), a data block is arranged on the bit channel {8, 3, 5, 6, 9, 10, 12, 7, 11, 13, 14, 15} and encoding is performed (13*c*).

If an error occurs during decoding of the first transmission and retransmission (2nd Tx) is performed, data arranged on a bit channel with a low reliability among the first transmitted data is arranged on a bit channel with a high reliability and then encoding is performed.

Specifically, assuming that the position of 6 bits of the 12 bits first transmitted is changed, the data bits (u4, u0, u1, u2, u5, u6) arranged in bit channel {8, 3, 5, 6, 9, 10} are arranged in bit channel {12, 7, 11, 13, 14, 15}, and then encoding is performed. At this time, decoding can be performed by the receiver in FIG. 14.

FIG. 14 illustrates a receiver structure supporting IF-HARQ according to an embodiment of the present disclosure.

Referring to FIG. 14, a hard decision value of the data bit arranged in the bit channel {12, 7, 11, 13, 14, 15} in the first transmission is used in decoding for retransmission. Here, the hard decision means that the received data is decoded only into binary (0 or 1).

It is desirable to implement IF-HARQ combining by combining the log-likelihood ratio (LLR) of the decoded bits. It is possible to allocate retransmitted data bits to a bit channel by considering the reliability of the bit channel transmitted in the first transmission. It is possible to allocate bit channels in retransmission in the reverse order of the reliability of the first transmission. Hereinafter, it will be described in more detail based on FIG. 13.

The data bits (u4, u0, u1, u2, u5, u6) arranged in the bit channel {8, 3, 5, 6, 9, 10} are arranged in the bit channel {15, 14, 13, 11, 7, 12}, and then encoding may be performed. Through this, greater performance gains can be expected as the reliability of each bit is improved on average.

Incremental Redundancy (IR)

In order to support IR-HARQ of polar code, the mother code size can be increased in retransmission. For example, if the mother code size used in the first transmission is N, a mother code size increased to 2N may be used in retransmission. Hereinafter, it will be described in detail with reference to FIG. 15. At this time, considering complexity, the increased mother code size may be limited to 2N or 4N even when retransmission is repeatedly performed. In other words, when retransmission is repeatedly performed, the maximum value of the mother code size used may be limited to two or four times the mother code size used in the first transmission. This is because complexity may increase excessively if the mother code size repeatedly increases with each retransmission.

Hereinafter, it will be described in detail with reference to FIG. 15.

FIG. 15 is a diagram for explaining an encoding operation related to incremental redundancy according to an embodiment of the present disclosure.

FIG. 15 (*a*) illustrates bit channel allocation for a polar sequence and data block size K=6 when the mother code size is N=8 and 16.

FIG. 15 (*b*) illustrates an encoding operation when the mother code size is N=8 and 16.

In FIG. 15, it is assumed that the mother code size is N=8 when the first transmission (1st Tx) of a polar code with a data block size of K=6, and the mother code size is N=16 when retransmission (2nd Tx).

In the case of the first transmission, since K=6, a data block is arranged at the bit channel index {2, 4, 3, 5, 6, 7} determined from the bit channel indices 15*b* rearranged according to the reliability order among the bit channel indices 15*a*. Based on this, polar encoding is performed.

When an error occurs after decoding of the first transmission and retransmission is performed, if a polar sequence for mother code size N=16 is applied, the bit channel index where the data block should be arranged is as follows.

Among the bit channel indices 15*c*, the bit channel indices determined from the bit channel indices 15*d* rearranged in order of the reliability are {12, 7, 11, 13, 14, 15}. Therefore, encoding must be performed by arranging a data block in the corresponding bit channel index {12, 7, 11, 13, 14, 15}.

However, in order to support IR HARQ, the characteristic that the coded bit generated for first transmission must be included in the coded bit generated for retransmission must be satisfied.

Hereinafter, it will be described in detail in relation to the corresponding characteristic. When the mother code size increases from N to 2N, a polar encoded codeword can be expressed as $$[U_2 \ \ U_1]\begin{bmatrix} F & 0 \\ F & F \end{bmatrix} = [(U_1 + U_2)F \ U_1F].$$

Here, F is a kernel for polar encoding of mother code size N, and $[U_2\ U_1]$ is a data block. In this case, $U_1F$ must be the codeword of the first transmission to support IR HARQ. Therefore, data arranged in bit channel index 7 (data to which bit channel index 7 is allocated) must also be allocated to bit channel index 10.

In other words, when data is arranged in the bit channel index {12, 7, 11, 13, 14, 15} determined according to the reliability order, the data is not arranged in bit channel index 10, so the coded bits at the time of first transmission are not included in the coded bits at the time of retransmission. In this case, the characteristics to support IR-HARQ are not met.

A copy operation may be considered to solve the above problem. The copy operation is an operation to copy data bits to specific bit channel index(s) so that the characteristics for supporting IR HARQ are met. Specifically, through the copy operation, the same data bits are arranged in bit channel index 7 and bit channel index 10, and then encoding can be performed. Such a copy operation can be performed in cases 1) and 2) below.

1) When retransmitting, the mother code size increases (e.g. 8→16)
2) A data block is arranged at the bit channel index corresponding to the upper polar encoder. That is, the data block is arranged at the bit channel index (e.g. 7) corresponding to the lower polar subcode (e.g. 0 to 7).

The copy operation can be performed as follows.

The data bit arranged in the lower polar subcode of the polar code (e.g. second polar code) for retransmission is additionally arranged in the bit channel index(s) of the second polar code corresponding to the bit channel index(s) (e.g. one or more first bit channels) of the polar code (e.g. first polar code) where the data bit was arranged during the initial transmission.

According to one embodiment, the copy operation may be performed based on the size of the data block being more than a certain value. The specific value may mean the data block size when a data block (or data bit) is first arranged in the bit channel index belonging to the lower polar subcode among the bit channel indices of the polar code for retransmission.

The specific value described above may be defined based on the ranking of the bit channel index belonging to the lower polar subcode. Specifically, when the bit channel indices of the polar code are rearranged in a reliability order (descending order), the specific value may be related to the ranking of the bit channel index with the highest reliability among the bit channel indices belonging to the lower polar subcode.

The specific value will be described in detail below based on FIG. 15.

According to the example of FIG. 15, when the mother code size (N) is 16, bit channel indices related to the upper polar encoder (or belonging to the lower polar subcode) are 0 to 7. Among bit channel indices 0 to 7, the bit channel index with the highest reliability is 7.

The entire bit channel indices rearranged according to the reliability order (descending order) are as follows as bit channel indices in reverse order of 15d.

{15, 14, 13, 11, 7, 12, 10, 9, 6, 5, 3, 8, 4, 2, 1, 0}

The most reliable bit channel index (7) among the bit channel indices of the lower polar subcode has a 5th ranking among the total bit channel indices {15, 14, 13, 11, 7, 12, 10, 9, 6, 5, 3, 8, 4, 2, 1, 0} rearranged according to the reliability order (descending order).

Therefore, in this case, the specific value is 5, and when the data block size is 5 or more, the retransmitted coded bit does not include the coded bit (15*b*) at the time of first transmission, so the copy operation needs to be performed.

Based on the copy operation, a coded bit for retransmission is generated (15*e*). The coded bit (15*e*) for retransmission includes the coded bit (15*b*) at the time of first transmission.

In FIG. 15 (*b*), 15*f*-0 to 15*f*-15 indicate a reliability. Specifically, 15*f*-0 indicates the reliability of bit channel index 0 among bit channel indices (0 to 15). 15*f*-15 indicates the reliability of bit channel index 15 among bit channel indices (0 to 15). The reliability can be expressed as a probability value related to the occurrence of an error. Bit channel index 15 has the highest reliability because its value (0.0001) is the smallest, and bit channel index 0 has the lowest reliability because its value (1.0) is the greatest.

Among the bit channel indices (0 to 15), 15*f*-0 to 15*f*-7 are related to the upper polar encoder, and 15*f*-8 to 15*f*-15 are related to the lower polar encoder.

Puncturing, Shortening and Repetition

Hereinafter, embodiments related to puncturing, shortening, and repetition operations applied to 1st transmission will be described.

No Puncturing/Shortening/Repetition in the 1st Transmission

If the size of the coded bit in the first transmission is $2^n$ (n: natural number), a rate matching operation such as a puncturing/repetition is not required. In the case of IR HARQ, coded bits are additionally transmitted in retransmission, so the coding rate decreases after combining. As the coding rate is reduced as described above, performance gains can be obtained. At this time, a method of generating a new coded bit may be based on at least one of Method 1 or Method 2 below.

Method 1

This embodiment is a method of transmitting all or part of the coded bits generated through a polar encoder that generated the coded bits at the time of first transmission without increasing the mother code size. That is, this is a method in which all or part of the first transmission is repeated. Hereinafter, it will be described in detail with reference to FIGS. 16 and 17.

It is assumed that in the first transmission, a coded bit is generated with a polar code of N=32, and in retransmission, a coded bit is generated with a polar code of N=64.

FIG. 16 illustrates bit channel indices rearranged in order of a reliability of a bit channel according to an embodiment of the present disclosure. The bit channel indices may be bit channel indices determined according to Table 5 above. Specifically, FIG. 16 (*a*) shows bit channel indices when N=32, and FIG. 16 (*b*) shows bit channel indices when N=64.

In FIG. 16 (*b*), when the data block size is less than 7 according to the polar sequence of N=64, data is arranged in the lower polar encoder. That is, a bit channel index is allocated to data in the range of 32 to 63. In this case, U2=0 in the N=64 codeword expressed in the form of $[(U_1+U_2)F\ U_1F]$, and the final codeword becomes $[U_1F\ U_1F]$. Therefore, in retransmission, coded bit $U_1F$ becomes a repetition of the first transmission $U_1F$.

FIG. 17 is a diagram illustrating data arranged in a polar encoder based on a specific data block size when an operation related to a rate matching is not performed according to an embodiment of the present disclosure.

Referring to FIG. 17, the data block size (K) is 3, and the mother code size of the polar encoder is 32 (17*b*) and 64 (17*c*).

17*a* represents the bit channel index, and 17*b* represents the arrangement of data bits (allocation of bit channel index to data bits) for N=32 polar encoder. In 17*b*, the bit channel indices are shown shifted to the right by 32 for comparison with the arrangement of the N=64 polar encoder, to facilitate confirmation of whether the characteristics for IR HARQ support are satisfied. 17*c* shows the arrangement of data bit index for N=64 polar encoder.

Method 2

This embodiment is a method of transmitting all or part of the coded bits generated based on the increased mother code size compared to the first transmission.

Specifically, according to this embodiment, generation of coded bits for retransmission may be performed as follows.

The copy operation is performed based on the increased mother code size (e.g. N→2N) compared to the first transmission. Through the copy operation, the data bit is arranged in the corresponding bit channel index so that the coded bit for first transmission is included in the coded bit for retransmission.

FIG. 18 is a diagram illustrating data arranged in a polar encoder based on a specific data block size when an operation related to a rate matching is not performed according to an embodiment of the present disclosure.

Referring to FIG. 18, the data block size (K) is 7, and the mother code size of the polar encoder is 32 (18*b*) and 64 (18*c*). The bit channel indices (0 to 31) of the N=32 polar encoder are shown shifted to the right by 32 in the same manner as in FIG. 17. 18*a*, 18*b*, and 18*c* correspond to 17*a*, 17*b*, and 17*c* in FIG. 17, and redundant descriptions will be omitted.

According to the polar sequence according to FIG. 16 (*b*), the bit channel index allocated to 7 bit data in the N=64 polar encoder is {63, 62, 61, 59, 55, 47, 31}. However, if 7 bit data is allocated only to {63, 62, 61, 59, 55, 47, 31}, the retransmitted coded bit does not include the coded bit (18*b*) at the time of first transmission.

Therefore, in order to include the coded bit (18*b*) of the first transmission, data must be arranged in bit channel index 60 (18*c*). Based on the copy operation, the same data is arranged in bit channel index 60 and bit channel index 31. At this time, all data of the lower polar subcode of bit channel index 0 to 31 is configured as frozen bit except bit channel index 31. This means that the $U_1+U_2$ value of $(U_1+U_2)F$ is the same as the first transmission except for 1 bit.

The coded bits of the first transmission is included to the retransmitted coded bits, and most of the coded bits in the retransmitted coded bits are the same as the coded bits of the first transmission. The retransmitted coded bit is similar to a codeword transmitted based on a repetition operation.

From the above analysis, when the number of data bits arranged in the lower polar subcode in retransmission is more than a certain value (e.g. Klth>0, integer), a polar code with an increased mother code size compared to the initial transmission may be configured to be used. That is, if the number of data bits arranged in the lower polar subcode is greater than or equal to Klth, a polar code with an increased mother code size compared to the initial transmission can be used to generate coded bits for retransmission.

In this case, if the number of data bits arranged in the lower polar subcode is less than a certain value (Klth), the coded bit selected from the codeword used in the first transmission can be used for retransmission. At this time, the Klth value may be predefined or indicated through L1/MAC/RRC signaling.

Hereinafter, an embodiment related to a case in which the puncturing or shortening is performed in the initial transmission will be described in detail. According to the NR standard, the puncturing is performed when the coding rate is 7/16 or less, and if not, the shortening is performed.

Puncture in the 1st Transmission

When generating a codeword for retransmission, the following matters can be considered. In order to increase the mother code size N used when generating a codeword in the first transmission, a data bit must be arranged through a copy operation in the bit channel index corresponding to the lower polar subcode. For example, the description assumes that the mother code size of the first transmission is N=32, and the mother code size of the retransmission is N=64.

The data block size must be greater than 7 to allocate data to the bit channel index corresponding to the lower polar subcode. Referring to FIG. 16 (*b*), bit channel index 31, which has the highest reliability among the bit channel indices (0~31) corresponding to the lower polar subcode, is arranged at the 7th position.

Therefore, when the above-described embodiment of No puncturing/shortening/repetition in the 1st transmission (Method 1, Method 2) performs the puncturing in the first transmission, the same can be applied.

Figure 19:
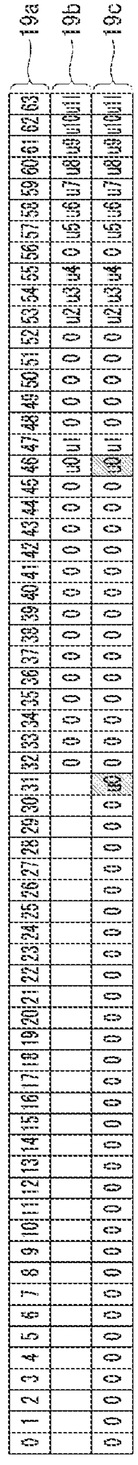
FIG. 19 is a diagram illustrating data arranged in a polar encoder based on a specific data block size when a puncturing is performed according to an embodiment of the present disclosure.

FIG. 19 is a diagram illustrating data arranged in a polar encoder based on a specific data block size when a puncturing is performed according to an embodiment of the present disclosure.

Referring to FIG. 19, the data block size (K) is 12, and the mother code size of the polar encoder is 32 (19*b*) and 64 (19*c*). The bit channel indices (0 to 31) of the N=32 polar encoder are shown shifted to the right by 32 in the same manner as in FIG. 17. 19*a*, 19*b*, and 19*c* correspond to 17*a*, 17*b*, and 17*c* in FIG. 17, and overlapping descriptions are omitted.

Unlike 17*b* and 17*c* to which rate matching-related operations are not applied, 19*b* and 19*c* of FIG. 19 represent data allocated to the bit channel index based on the puncturing.

The rate matching operation (puncturing) related to 19*b* and 19*c* is described in detail below.

1) For the initial transmission, the puncturing is performed based on N=32 and E=30. 19*b* indicates a data block arranged in the bit channel index based on the puncturing. Here, E means data payload size.

2) For the retransmission, the puncturing is performed according to N=64 and E=60. 19*c* indicates a data block arranged in the bit channel index based on the puncturing. The copy operation is performed in the same way as 18*b* and 18*c* in cases of FIG. 18, and the same data bit (u0) is arranged at bit channel index 46 and bit channel index 31.

Shortening in the 1st Transmission

According to the NR standard, the shortening is performed when the coding rate is greater than 7/16. At this time, bit channel index E to bit channel index N−1 are configured as frozen (bit value 0) and polar encoding is performed.

FIG. 20 is a diagram illustrating data arranged in a polar encoder based on a specific data block size when a shortening is performed according to an embodiment of the present disclosure.

Referring to FIG. 20, the data block size (K) is 12, and the mother code size of the polar encoder is 32 (20*b*) and 64 (20*c*). The bit channel indices (0 to 31) of the N=32 polar encoder are shown shifted to the right by 32 in the same manner as in FIG. 17. 20*a*, 20*b*, and 20*c* correspond to 17*a*, 17*b*, and 17*c* in FIG. 17, and overlapping descriptions will be omitted.

Unlike 17*b* and 17*c* to which rate matching-related operations are not applied, 20*b* and 20*c* of FIG. 20 represent data allocated to the bit channel index based on rate matching-related operations (shortening/puncturing).

Rate matching operations (shortening/puncturing) related to 20*b* and 20*c* will be described in detail below.

1) For the initial transmission, the shortening is performed based on N=32 and E=24. 20*b* represents a data block arranged in the bit channel index based on the shortening.

2) For the retransmission, the puncturing is performed according to N=64 and E=60. 20*c* represents a data block arranged in the bit channel index based on the puncturing.

In the first transmission, the shortening is performed because the coding rate is 1/2 (i.e. 12/24), and in the retransmission, the puncturing is performed because the coding rate is 1/5 (i.e. 12/60). In the first transmission, the shortening of N−E=32−24=8 bits must be performed, so the data bits corresponding to bit channel index 56~63 must be configured as frozen (0).

However, since the puncturing is performed in the retransmission, a data bit must be allocated to the corresponding bit channel index. In this case, since the codeword generated for retransmission cannot include the codeword generated for the first transmission, the characteristic for supporting IR-HARQ that increases the mother code size is not met. Hereinafter, an embodiment for solving the above-mentioned problems will be described in detail.

If the coded bit is transmitted using the shortening in the first transmission, a method of generating the coded bit in retransmission may be based on at least one of Methods 3 to 5 below.

Method 3

This embodiment is a method in which all or part of the coded bits generated for first transmission are used in retransmission. This method supports HARQ using repetition without increasing the mother code size.

Method 4

If coded bits are transmitted using shortening in the first transmission, use of the incremental freezing (IF) method may be considered. That is, in retransmission, coded bits generated using the incremental freezing (IF) method can be transmitted.

Method 5

This embodiment is a method of arranging the data bit in the bit channel index to increase the mother code size in retransmission and include the codeword of the first transmission when generating the coded bit.

According to this embodiment, in generating coded bits for retransmission, data bits are arranged as follows.

Data bits are not arranged in bit channel indices 56 to 63, and data bits are arranged in the bit channel index with the next highest reliability after the corresponding bit channel index (56 to 63). Hereinafter, it will be described in detail with reference to FIG. 21.

FIG. 21 is a diagram illustrating data arranged in a polar encoder to support IR-HARQ when a shortening is performed in an initial transmission according to an embodiment of the present disclosure.

FIG. 21 is an example of a method of arranging a data bit supporting IR-HARQ using a polar encoder of N=32, E=24 in first transmission, and N=64, E=60 in retransmission when K=12. 21*a*, 21*b*, and 21*c* correspond to 20*a*, 20*b*, and 20*c* in FIG. 20, and redundant descriptions will be omitted.

Referring to 21*c* of FIG. 21, bit channel index {44, 50, 52} and bit channel index {29, 30, 31} are each allocated to the same data bit by copy operation to support IR-HARQ.

When allocating a bit channel index to a 12-bit data block at N=64, bit channel index {63, 62, 61, 59, 55, 47, 31, 60, 58, 57, 54, 53} selected in order of the high reliability must be used. However, since the shortening was performed on 8 bits (bit channel index 24 to 31) at the time of initial transmission (21*b*), when generating coded bits for retransmission to support IR-HARQ, in bit channel indices 56 to 63, data bits are not arranged and frozen bit (0) is configured.

Specifically, in bit channel index {63, 62, 61, 59, 55, 47, 31, 60, 58, 57, 54, 53}, only bit channel index {55, 47, 31, 54, 53} is used, excluding bit channel index 56 to 63, so 7 bit channel indices for arrangement of data bits must be additionally determined. The data bit is allocated to the bit channel index {46, 51, 45, 30, 43, 29, 39}, which has the next highest reliability after bit channel index 53 in the range excluding bit channel index 56 to 63 among all bit channel indices (21*c*). The coded bits are generated based on the allocation of data bits as described above.

Method 6

Unlike Methods 3 to 5, which assume that shortening is used during first transmission, this embodiment limits the type of rate matching operation during initial transmission to support IR-HARQ. This embodiment is a method of generating coded bits by increasing the mother code size without applying shortening regardless of the value of the coding rate at the time of first transmission. This will be described in detail below.

IR-HARQ can be supported by using a mother code size (e.g. 2N) that is increased by a certain value (e.g. N) than the mother code size (e.g. N) used in the first transmission at the time of the corresponding first transmission. At this time, IR-HARQ can be supported by generating coded bits using the puncturing instead of the shortening. The increased mother code size may be based on $2^n$ (n is a natural number) times the mother code size configured to be used in the first transmission.

For example, it is assumed that K=12, E=24, and mother code size N=32 is configured to be used for the initial transmission. In this case, because the coding rate (K/E) is 1/2, the shortening must be performed. According to this embodiment, regardless of the coding rate, the shortening is not applied and the puncturing is applied to generate coded bits for the first transmission. At this time, the mother code size used may be twice the smallest value (32) among mother code sizes (e.g. 32, 64, 128 . . . ) greater than the data payload size (E=24). For example, the coded bit for the first transmission can be generated by puncturing 40 bits in the codeword generated using a mother code size (N=64) that is twice the mother code size (N=32) used in the first transmission. Hereinafter, it will be described with reference to FIG. 22.

FIG. 22 is a diagram for explaining an operation in which a codeword is generated using puncturing instead of shortening in the first transmission according to an embodiment of the present disclosure. Specifically, FIG. 22 illustrates a method of arranging a data block in a bit channel index to generate a codeword based on Method 6 above.

The data bits must be arranged in bit channel indices determined according to the reliability order within a range excluding bit channel indices where the puncturing is performed and the frozen bits are configured.

Since 40 bits are punctured, bit channel index 0 to 39 must be configured as frozen bits. At this time, since all bit channel indices (0 to 31) belonging to the lower polar subcode are included in the bit channel index range in which the frozen bit is configured, the data bits to be arranged in bit channel index 0~31 belonging to the lower polar subcode must be arranged in bit channel index 32~63 belonging to the upper polar subcode.

Referring to FIG. 16 (*b*), the bit channel index where 12 data bits will be arranged when puncturing is not considered is {63,62,61,59,55,47,31,60,58,57,54,53}. The data bits in the corresponding bit channel index may be arranged as shown in 20*c* of FIG. 20.

However, since bit channel index 31 must be configured as a frozen bit, the data bit (u0) to be arranged in bit channel index 31 is arranged in bit channel index 46 with a next highest reliability within the range excluding the bit channel indices (0 to 31) where the frozen bit is configured (22*b*).

According to one embodiment, the bit channel index with the next highest reliability may be determined as follows. It can be determined based on the bit channel index (e.g. 53) with the lowest reliability in the range (e.g. {63,62,61,59,55,47,60,58,57,54,53}) excluding bit channel indices (0 to 31) where frozen bit is configured among the bit channel indices (e.g. {63,62,61,59,55,47,31,60,58,57,54,53}) selected according to the reliability order (e.g. descending order).

Referring to FIG. 16 (*b*), in the range excluding the bit channel indices (0 to 31) where the frozen bit is configured (e.g. {63,62,61,59,55,47,60,58),57,54,53}), the bit channel index with the lowest reliability is 53. At this time, the bit channel index with the next highest reliability is bit channel index 46 with the next highest reliability after bit channel index 53.

According to one embodiment, the application of Method 6 described above may be limited to cases where the size of the codeword that is the output of rate matching (puncturing) is greater than a preconfigured value (e.g. N).

As a specific example, it may be assumed that a codeword for initial transmission is generated based on the puncturing, and the size of the generated codeword is greater than the preconfigured value. In this case, the size of the polar code used to generate the codeword for the initial transmission may be based on twice the preconfigured value. The preconfigured value may be based on the smallest value (e.g. N) among the sizes (e.g. N, 2N, 4N, etc.) of the polar code preconfigured for the initial transmission.

In terms of implementation, operations according to the above-described embodiments (e.g. operations related to polar codes to support IR-HARQ based on at least one of Methods 1 to 6) can be processed by the devices of FIGS. 1 to 4 and FIG. 6 described above (e.g. processors 202*a* and 202*b* in FIG. 2).

Additionally, operations according to the above-described embodiments (e.g. operations related to polar codes to support IR-HARQ based on at least one of Methods 1 to 6) may be stored in memory (e.g. 204*a*, 204*b* in FIG. 2) in the form of instructions/programs (e.g. instruction, executable code) for driving at least one processor (e.g. processors 202*a* and 202*b* in FIG. 2).

Hereinafter, the above-described embodiments will be described in detail with reference to FIG. 23 in terms of operation of the wireless device (e.g. the first wireless device 200*a* and/or the second wireless device 200*b* in FIG. 2). The methods described below are divided for convenience of explanation, and it goes without saying that some components of one method may be replaced with some components of another method or may be applied in combination with each other.

Figure 23:
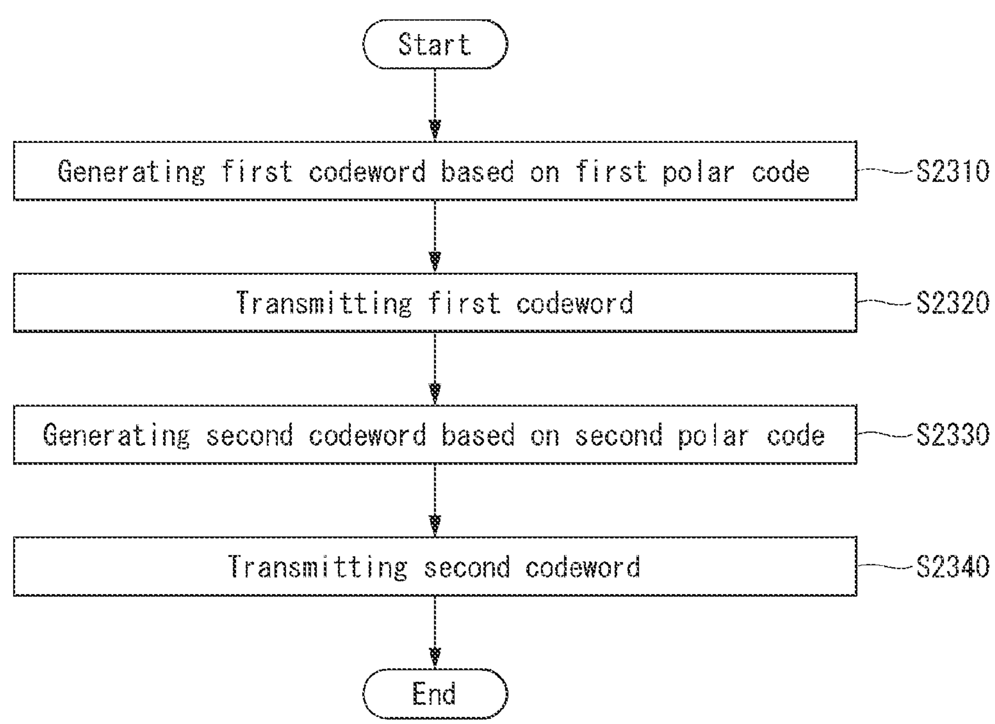
FIG. 23 is a flowchart illustrating a method for transmitting a signal based on HARQ according to an embodiment of the present disclosure.

FIG. 23 is a flowchart illustrating a method for transmitting a signal based on HARQ according to an embodiment of the present disclosure.

Referring to FIG. 23, a method for transmitting a signal based on HARQ by a wireless device according to an embodiment of the present disclosure includes generating a first codeword based on a first polar code (S2310), transmitting the first codeword (S2320), generating a second codeword based on a second polar code (S2330), and transmitting the second codeword (S2340).

In S2310, a first wireless device generates the first codeword based on the first polar code.

According to the above-described S2310, the operation of the first wireless device (e.g. 200*a*/200*b* in FIG. 2) generating the first codeword based on the first polar code can be implemented by the devices of FIGS. 1 to 4. For example, referring to FIG. 2, one or more processors (202*a*/202*b*) may control one or more transceivers (206*a*/206*b*) and/or one or more memories (204*a*/204*b*) to generate the first codeword based on the first polar code.

In S2320, the first wireless device transmits the first codeword to the second wireless device. Transmission of the first codeword may be based on the initial transmission or first transmission described above in relation to support of IR-HARQ.

According to the above-described S2320, the operation of transmitting the first codeword from the first wireless device (e.g. 200*a*/200*b* in FIG. 2) to the second wireless device (e.g. 200*a*/200*b* in FIG. 2) can be implemented by the devices of FIGS. 1 to 4. For example, referring to FIG. 2, the one or more processors 202*a* may control one or more transceivers 206*a* and/or one or more memories 204*a* to transmit the first codeword to the second wireless device 200*b*.

In S2330, the first wireless device generates the second codeword based on the second polar code.

According to one embodiment, the second polar code has a size $2^n$ times the size of the first polar code, and n is an integer greater than 0. At this time, considering complexity, the maximum size of the second polar code may be limited to 2 or 4 times the size of the first polar code.

According to one embodiment, the size of the second polar code may be determined based on one or more first bit channel indices allocated to the data block related to the first codeword among the bit channel indices of the first polar code.

According to one embodiment, the second codeword may be generated by allocating a bit channel index of the second polar code to a data block related to the first codeword. Specifically, one or more second bit channel indices among the bit channel indices of the second polar code may be allocated to the data block related to the first codeword.

According to one embodiment, the one or more second bit channel indices may i) include the one or more first bit channel indices, or ii) include bit channel indices obtained by adding a first specific value to the one or more first bit channel indices. Hereinafter, a specific example will be described with reference to FIG. 16.

If the size of the first polar code (i.e. the value of N, which is the mother code size) is 32, the one or more first bit channel indices selected in reliability order (e.g. descending order) based on the size of the data block (K=4) related to the first codeword in the polar encoder may be 31, 30, 29, and 27 (See in FIG. 16 (*a*)).

In case of i), the one or more second bit channel indices may be 31, 30, 29, and 27. In case ii), the one or more second bit channel indices may be 63, 62, 61, and 59. At this time, the first specific value may be 32.

According to one embodiment, the first specific value may be based on the difference between the size of the second polar code and the size of the first polar code. This will be described in detail with reference to examples related to the one or more second bit channels described above.

When the size (N) of the second polar code is 32, since the first specific value is 0 (=32−32), the one or more second bit channel indices are the same as the one or more first bit channels.

When the size N of the second polar code is 64, since the first specific value is 32 (=64−32), the one or more second bit channel indices may be bit channel indices (e.g. 63, 62, 61, 59) obtained by adding 32 to the one or more bit channel indices (e.g. 31, 30, 29, 27).

According to one embodiment, based on a certain number or more of bit channel indices belonging to a lower polar subcode of the first polar code being included in the one or more first bit channel indices, the size of the second polar code may be determined to be greater than the size of the first polar code. The certain number may be a value based on the Klth described above.

According to one embodiment, the one or more second bit channel indices may be based on one or more specific bit channel indices determined based on an order of a reliability related to a polar encoder and a size of the data block related to the first codeword. At this time, the one or more second bit channel indices may be determined based on a copy operation.

Based on the one or more specific bit channel indices including one or more bit channel indices belonging to a lower polar subcode of the second polar code, the one or more second bit channel indices are determined as bit channel indices according to ii) above through a copy operation.

The copy operation may be performed based on the size of the data block being greater than or equal to a second specific value related to the second polar code.

The second specific value may be determined based on a ranking of a bit channel index with a highest value of a reliability among the bit channel indices belonging to the lower polar subcode of the second polar code. The ranking may be defined in order according to a value of the reliability within a range of all bit channel indices of the second polar code.

The above-described embodiment may be based on the description of FIG. 15 related to the copy operation. Specifically, when the size (N) of the second polar code is 16, bit channel indices belonging to the lower polar subcode are 0 to 7. Among bit channel indices 0 to 7, the bit channel index with the highest reliability is 7. The total bit channel indices of the second polar code rearranged according to the reliability order (descending order) are bit channel indices in reverse order of 15d and are as follows.

{15, 14, 13, 11, 7, 12, 10, 9, 6, 5, 3, 8, 4, 2, 1, 0}

The bit channel index 7, which is the most reliable among the bit channel indices of the lower polar subcode, has the 5th ranking among all bit channel indices {15, 14, 13, 11, 7, 12, 10, 9, 6, 5, 3, 8, 4, 2, 1, 0} rearranged according to the reliability order (descending order). Therefore, in this case, the second specific value is 5.

When the size (K) of the data block related to the first codeword is greater than or equal to 5 the codeword based on the one or more specific bit channel indices does not include the first codeword 15*b*. Therefore, the copy operation is performed to support IR-HARQ. Based on the copy operation, the one or more second bit channel indices may be determined as bit channel indices 15*e* including bit channel indices (10, 11, 12, 13, 14, 15) obtained by adding the first specific value (16−8=8) to the one or more first bit channel indices (2, 3, 4, 5, 6, 7).

According to one embodiment, based on the size of the data block being less than or equal to a third specific value, the size of the first polar code and the size of the second polar code are the same, and the one or more second bit channel indices may include the one or more first bit channel indices.

The third specific value may be determined based on the ranking of the bit channel index with the highest reliability among the bit channel indices belonging to the lower polar subcode of the first polar code. The ranking may be defined in order according to the reliability value within the range of all bit channel indices of the first polar code, similar to the case of the second specific value described above. Hereinafter, it will be described in detail with reference to FIGS. 16 (*a*) and (*b*).

The size of the first polar code is 32, and the bit channel indices rearranged according to reliability order (descending order) are as shown in FIG. 16 (*a*). At this time, the bit channel index with the highest reliability among the bit channel indices belonging to the lower polar subcode of the first polar code is 15. In FIG. 16 (*a*), the ranking of bit channel index 15 is 6. Accordingly, the third specific value may be determined to be 6.

When the size of the data block is less than 6, data bits are arranged only in bit channel indices (e.g. 16 to 31) belonging to the upper polar subcode of the first polar code. In addition, even assuming the case where the second polar code is greater than the size of the first polar code (e.g. FIG. 16 (*b*)), data blocks with a size less than or equal to 6 are arranged in bit channel indices 32 to 63 belonging to the upper polar subcode of the second polar code.

That is, when the size of the data block is less than or equal to the third specific value, the data block is arranged in the same way as in the case of initial transmission, even if the size of the polar code for retransmission is increased compared to the initial transmission. In this case, since there is no improvement in coding gain even if the size of the polar code is increased, the size of the second polar code for retransmission may be determined to be the same as the size of the first polar code for initial transmission. According to one embodiment, based on the one or more second bit channel indices including bit channel indices obtained by adding a specific value to the one or more first bit channel indices, the following operations 1) and/or 2) may be performed.

1) Based on the coding rate of the first codeword being greater than the value related to the shortening for rate matching the first codeword may be generated based on the shortening or puncturing. At this time, the value related to shortening for rate matching may be 7/16.

2) Based on the first codeword being generated based on the shortening, in the second codeword, a bit value for at least one bit channel index related to the shortening among the bit channel indices of the second polar code may be configured as 0.

According to one embodiment, the shortening or the puncturing may be applied based on the size of the first codeword not being a multiple of 2.

According to one embodiment, when the first codeword is generated based on the shortening, the one or more second bit channel indices may include bit channel indices determined in order according to a value of a reliability in a range excluding at least one bit channel indices related to the shortening among the bit channel indices of the second polar code. The order according to the value of reliability may be in descending order of the value (that is, the bit channel index with the highest reliability→the bit channel index with the lowest reliability). This embodiment may be based on Method 5 above.

According to one embodiment, based on the first codeword being generated based on the puncturing, and based on the size of the first codeword being greater than a preconfigured value (e.g. N), the size of the first polar code may be based on twice the preconfigured value (e.g. 2N). The preconfigured value may be based on a smallest value (e.g. N) among sizes of a polar code (e.g. N, 2N, 4N . . . ) predetermined in relation to the generation of the first codeword. This embodiment may be based on Method 6 above.

The one or more first bit channel indices may include bit channel indices determined in order according to a value of a reliability in a range excluding at least one bit channel indices related to the puncturing among the bit channel indices of the first polar code. The order according to the reliability value may be in descending order of the corresponding value (that is, the bit channel index with the highest reliability→the bit channel index with the lowest reliability).

According to the above-described S2330, the operation of the first wireless device (e.g. 200*a*/200*b* in FIG. 2) generating the second codeword based on the second polar code can be implemented by the devices of FIGS. 1 to 4. For example, referring to FIG. 2, one or more processors (202*a*) may control one or more transceivers (206*a*) and/or one or more memories (204*a*) to generate the second codeword based on the second polar code.

In S2340, the first wireless device transmits the second codeword to the second wireless device. Transmission of the second codeword may be related to retransmission of the first codeword.

According to the above-described S2340, the operation of transmitting the second codeword from the first wireless device (e.g. 200*a*/200*b* in FIG. 2) to the second wireless device (e.g. 200*a*/200*b* in FIG. 2) can be implemented by the devices of FIGS. 1 to 4. For example, referring to FIG. 2, the one or more processors 202*a* may control one or more transceivers 206*a* and/or one or more memories 204*a* to transmit the second codeword to the second wireless device 200*b*.

According to one embodiment, the first wireless device may be based on a user equipment (UE) or a base station (BS). The second wireless device may be based on a base station (BS) or a user equipment (UE).

The effect of a method in which a first wireless device transmits a signal based on Hybrid Automatic Repeat request (HARQ) in a wireless communication system according to an embodiment of the present disclosure will be described as follows.

According to an embodiment of the present disclosure, the second codeword related to retransmission of the first codeword is generated based on the second polar code. At this time, the bit channel indices of the second polar code allocated to the data block of the first codeword may be based on one or more second bit channel indices. The one or more second bit channel indices may i) include the one or more first bit channel indices related to the first codeword, or ii) include bit channel indices obtained by adding a first specific value to the one or more first bit channel indices.

Since the characteristics for supporting IR HARQ are met as described above, IR HARQ based on polar code can be supported in a wireless communication system. Additionally, since IR HARQ based on polar code can be used for data transmission, system performance can be improved in terms of the reliability.

Additionally, according to the IR HARQ method based on polar code, since the received bits are immediately combined without decoding, the performance of polar code-based HARQ operation can be further improved compared to the existing IF-HARQ method.

According to an embodiment of the present disclosure, the one or more second bit channel indices may be based on one or more specific bit channel indices determined based on an order of a reliability related to a polar encoder and a size of the data block related to the first codeword. Based on the one or more specific bit channel indices including one or more bit channel indices belonging to a lower polar subcode of the second polar code, the one or more second bit channel indices are determined as bit channel indices according to ii) above through a copy operation.

As described above, cases in which a copy operation must be performed to support IR HARQ may be specifically defined. According to an embodiment of the present disclosure, since the copy operation is performed only when the characteristics for supporting IR HARQ are not met according to the basic operation related to polar encoding, operation efficiency can be improved when generating codewords for retransmission.

According to an embodiment of the present disclosure, when shortening or puncturing is applied to initial transmission, the one or more second bit channel indices related to retransmission may be determined to include the following bit channels. Specifically, the bit channel indices determined in order according to a value of a reliability in a range excluding at least one bit channel indices related to the corresponding operation (shortening/puncturing) among the bit channel indices of the second polar code may be included in the one or more second bit channel indices.

Therefore, even when shortening or puncturing is applied to the initial transmission, combining the retransmission codeword and the initial transmission codeword is possible. That is, polar code-based HARQ can be supported regardless of the type of operation applied for the rate matching.

Here, the wireless communication technology implemented in the device (eg., 200*a*/200*b* of FIG. 2) of the present disclosure may include LTE, NR, and 6G as well as Narrowband Internet of Things (NB-IoT) for low-power communication. For example, the NB-IoT technology may be an example of a LPWAN (Low Power Wide Area Network) technology, and may be implemented in standards such as LTE Cat NB1 and/or LTE Cat NB2, and is not limited to the above-described name. Additionally or alternatively, the wireless communication technology implemented in the device (eg., 200*a*/200*b* of FIG. 2) of the present disclosure may perform communication based on the LTE-M technology. For example, the LTE-M technology may be an example of LPWAN technology, and may be called by various names such as enhanced machine type communication (eMTC). For example, LTE-M technology may be implemented in at least one of various standards such as 1) LTE CAT 0, 2) LTE Cat M1, 3) LTE Cat M2, 4) LTE non-BL (non-Bandwidth Limited), 5) LTE-MTC, 6) LTE Machine Type Communication, and/or 7) LTE M, and is not limited to the above-described name. Additionally or alternatively, the wireless communication technology implemented in the device (eg., 200*a*/200*b* of FIG. 2) of the present disclosure may include at least one of ZigBee, Bluetooth, and Low Power Wide Area Network (LPWAN) in consideration of low power communication, and is not limited to the above-described name. For example, the ZigBee technology may generate PAN (personal area networks) related to small/low-power digital communication based on various standards such as IEEE 802.15.4, and may be called by various names.

The embodiments of the present disclosure described above are combinations of elements and features of the present disclosure. The elements or features may be considered selective unless otherwise mentioned. Each element or feature may be practiced without being combined with other elements or features. Further, an embodiment of the present disclosure may be constructed by combining parts of the elements and/or features. Operation orders described in embodiments of the present disclosure may be rearranged. Some constructions of any one embodiment may be included in another embodiment and may be replaced with corresponding constructions of another embodiment. It is obvious to those skilled in the art that claims that are not explicitly cited in each other in the appended claims may be presented in combination as an embodiment of the present disclosure or included as a new claim by subsequent amendment after the application is filed.

The embodiments of the present disclosure may be achieved by various means, for example, hardware, firmware, software, or a combination thereof. In a hardware configuration, the methods according to the embodiments of the present disclosure may be achieved by one or more Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, controllers, microcontrollers, microprocessors, etc.

In a firmware or software configuration, the embodiments of the present disclosure may be implemented in the form of a module, a procedure, a function, etc. For example, software code may be stored in a memory unit and executed by a processor. The memories may be located at the interior or exterior of the processors and may transmit data to and receive data from the processors via various known means.

Those skilled in the art will appreciate that the present disclosure may be carried out in other specific ways than those set forth herein without departing from the spirit and essential characteristics of the present disclosure. The above embodiments are therefore to be construed in all aspects as illustrative and not restrictive. The scope of the disclosure should be determined by the appended claims and their legal equivalents, not by the above description, and all changes coming within the meaning and equivalency range of the appended claims are intended to be embraced therein.

The invention claimed is:

1. A method comprising:

generating, by a first wireless device, a first codeword for transmission of a data block, based on a first polar code;

transmitting, by the first wireless device, the first codeword;

generating, by the first wireless device, a second codeword for retransmission of the data block, based on a second polar code; and transmitting, by the first wireless device, the second codeword, wherein a size of the second polar code is $2^n$ times a size of the first polar code, and n is an integer greater than 0, wherein the first codeword is generated by allocating one or more first bit channel indices among bit channel indices of the first polar code to bits of the data block, wherein the second codeword is generated by allocating one or more second bit channel indices among bit channel indices of the second polar code to the bits of the data block, wherein the one or more second bit channel indices include bit channel indices obtained by adding a first specific value to the one or more first bit channel indices, wherein, based on a code rate of the first codeword being greater than 7/16, and a code rate of the second codeword being smaller than or equal to 7/16:

the first codeword is generated based on a shortening, and the second codeword is generated based on a puncturing, the one or more second bit channel indices include bit channel indices determined by an order according to a value of a reliability in a range excluding one or more bit channel indices related to the shortening among the bit channel indices of the second polar code, and one or more bit values for the one or more bit channel indices related to the shortening in the second codeword are configured to 0.

2. The method of claim 1, wherein the first specific value is based on a difference value between the size of the second polar code and the size of the first polar code, wherein the one or more second bit channel indices are based on one or more specific bit channel indices which are determined based on the order of the reliability related to a polar encoder and a number of the bits of the data block, wherein, based on the one or more specific bit channel indices including one or more bit channel indices belonging to a lower polar subcode of the second polar code, the one or more second bit channel indices further include a bit channel index which is additionally allocated to one of the bits of the data block based on a copy operation.

3. The method of claim 2, wherein the copy operation is performed based on the number of the bits of the data block being greater than or equal to a second specific value related to the second polar code, wherein the second specific value is determined based on a ranking of a bit channel index with a highest value of the reliability among the bit channel indices belonging to the lower polar subcode of the second polar code, wherein the ranking is defined in order according to a value of the reliability within a range of all bit channel indices of the second polar code.

4. A first wireless device comprising:

one or more transceivers;

one or more processors controlling the one or more transceivers; and one or more memories operably connected to the one or more processors, and storing instructions that configure the one or more processors to perform operations when being executed by the one or more processors, wherein the operations include:

generating a first codeword for transmission of a data block, based on a first polar code;

transmitting the first codeword;

generating a second codeword for retransmission of the data block, based on a second polar code; and transmitting the second codeword, wherein a size of the second polar code is $2^n$ times a size of the first polar code, and n is an integer greater than 0, wherein the first codeword is generated by allocating one or more first bit channel indices among bit channel indices of the first polar code to bits of the data block, wherein the second codeword is generated by allocating one or more second bit channel indices among bit channel indices of the second polar code to the bits of the data block, wherein the one or more second bit channel indices include bit channel indices obtained by adding a first specific value to the one or more first bit channel indices, wherein, based on a code rate of the first codeword being greater than 7/16, and a code rate of the second codeword being smaller than or equal to 7/16:

the first codeword is generated based on a shortening, and the second codeword is generated based on a puncturing, the one or more second bit channel indices include bit channel indices determined by an order according to a value of a reliability in a range excluding one or more bit channel indices related to the shortening among the bit channel indices of the second polar code, and one or more bit values for the one or more bit channel indices related to the shortening in the second codeword are configured to 0.

5. The first wireless device of claim 4, wherein the first wireless device is based on a user equipment (UE) or a base station (BS).

6. One or more non-transitory computer-readable medium storing one or more instructions, wherein the one or more instructions configure one or more processors to perform operations when being executed by the one or more processors, wherein the operations include:

generating a first codeword for transmission of a data block, based on a first polar code;

transmitting the first codeword;

generating a second codeword for retransmission of the data block, based on a second polar code; and transmitting the second codeword, wherein a size of the second polar code is $2^n$ times a size of the first polar code, and n is an integer greater than 0, wherein the first codeword is generated by allocating one or more first bit channel indices among bit channel indices of the first polar code to bits of the data block, wherein the second codeword is generated by allocating one or more second bit channel indices among bit channel indices of the second polar code to the bits of the data block, wherein the one or more second bit channel indices include bit channel indices obtained by adding a first specific value to the one or more first bit channel indices, wherein, based on a code rate of the first codeword being greater than 7/16, and a code rate of the second codeword being smaller than or equal to 7/16:

the first codeword is generated based on a shortening, and the second codeword is generated based on a puncturing, the one or more second bit channel indices include bit channel indices determined by an order according to a value of a reliability in a range excluding one or more bit channel indices related to the shortening among the bit channel indices of the second polar code, and one or more bit values for the one or more bit channel indices related to the shortening in the second codeword are configured to 0.

* * * * *